(12) United States Patent
Yamashita et al.

(10) Patent No.: US 6,894,520 B2
(45) Date of Patent: May 17, 2005

(54) SEMICONDUCTOR DEVICE AND CAPACITANCE MEASUREMENT METHOD

(75) Inventors: Kyoji Yamashita, Kyoto (JP); Hiroyuki Umimoto, Hyogo (JP); Mutsumi Kobayashi, Kyoto (JP); Katsuhiro Ohtani, Nara (JP); Tatsuya Kunikiyo, Tokyo (JP); Katsumi Eikyu, Tokyo (JP)

(73) Assignees: Matsushita Electric Industrial Co., Ltd., Osaka (JP); Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/355,068

(22) Filed: Jan. 31, 2003

(65) Prior Publication Data

US 2003/0218473 A1 Nov. 27, 2003

(30) Foreign Application Priority Data

May 27, 2002 (JP) ........................................ 2002-151685

(51) Int. Cl.$^7$ .............................................. G01R 31/26
(52) U.S. Cl. ...................................... 324/765; 324/763
(58) Field of Search ........................... 324/158.1, 73.1, 324/765, 769, 678–679; 438/14–18; 702/117, 182, 183

(56) References Cited

U.S. PATENT DOCUMENTS

| 5,999,010 | A | 12/1999 | Arora et al. | |
|---|---|---|---|---|
| 6,404,222 | B1 * | 6/2002 | Fan et al. | 324/765 |
| 6,414,498 | B2 * | 7/2002 | Chen | 324/678 |

2001/0000948 A1  5/2001  Chen

FOREIGN PATENT DOCUMENTS

JP  2001-44203 A  2/2001

OTHER PUBLICATIONS

B.J. Sheu et al.,"A Capacitance Method to Determine Channel Lengths for Conventional and LDD MOSFET's", IEEE Electron Device Letters, vol. EDL–5, No. 11, pp. 491–493, Nov. 1984.

Yuan Taur et al., "A New 'Shift and Ratio' Method for MOSFET Channel–Length Extraction", IEEE Electron Device Letters, vol. 13, No. 5, pp. 267–269, May 1992.

James C Chen et al., "An On–Chip, Attofarad Interconnect Charge–Based Capacitance Measurement (CBCM) Technique", IDEM 96, pp. 3.4.1–3.4.4, 1996.

* cited by examiner

Primary Examiner—Vinh P. Nguyen
(74) Attorney, Agent, or Firm—McDermott Will & Emery LLP

(57) ABSTRACT

A CBCM measurement device includes a PMIS transistor, an NMIS transistor, a first reference conductor section connected to a first node, a second reference conductor section, with a dummy capacitor being formed between the first and second reference conductor sections, a first test conductor section connected to a second node, and a second test conductor section, with a test capacitor being formed between the first and second test conductor sections. The transistors are turned ON/OFF by using control voltages V1 and V2, and the capacitance of a target capacitor in the test capacitor is measured based on currents flowing through the first and second nodes. The capacitance measurement precision is improved by, for example, increasing a dummy capacitance.

11 Claims, 24 Drawing Sheets

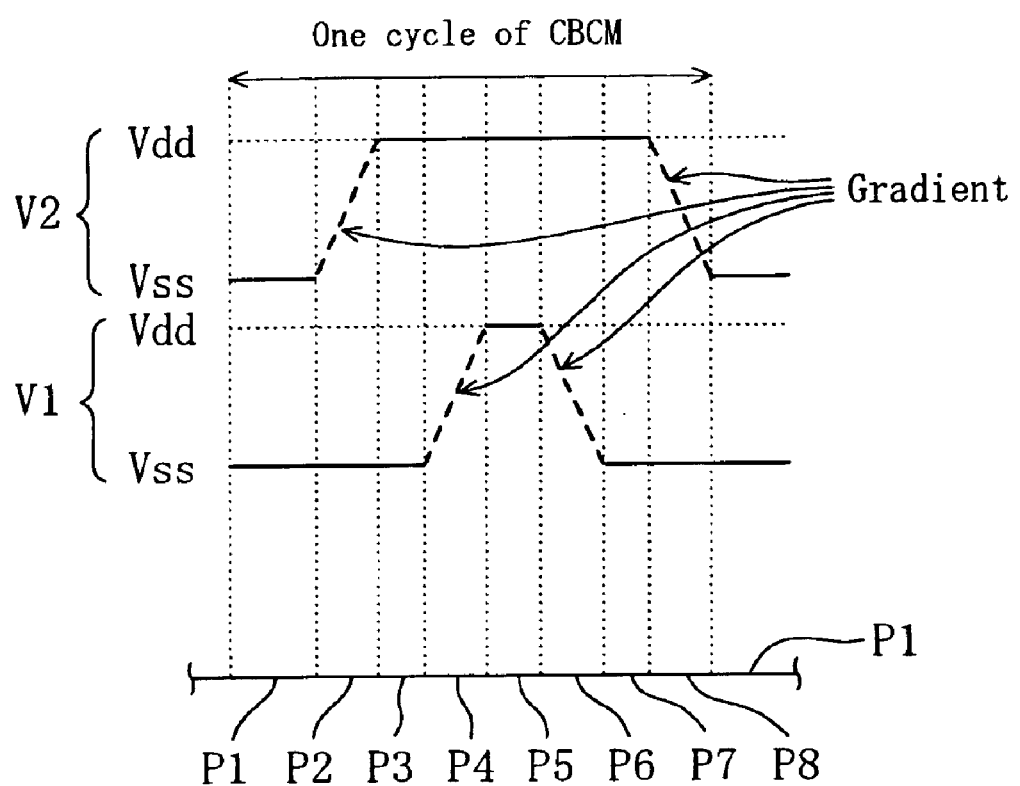

(Lg, Wg)

(Lg1, Wg)

(Lg2, Wg)

(Lg, Wg1)

(Lg, Wg2)

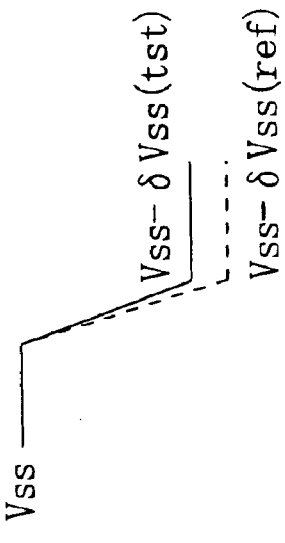
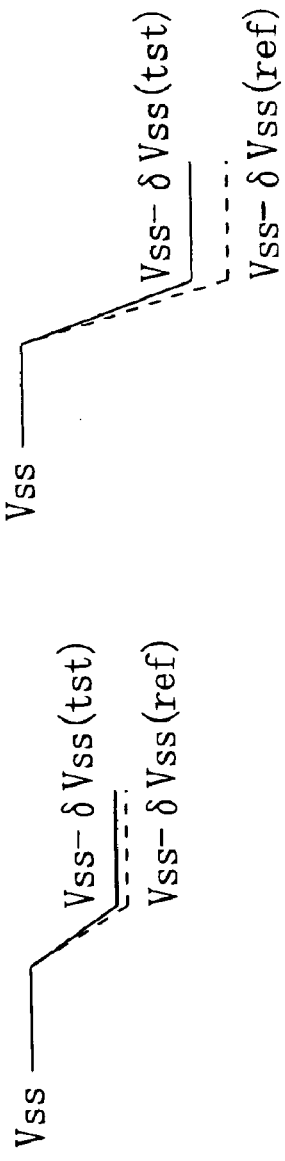
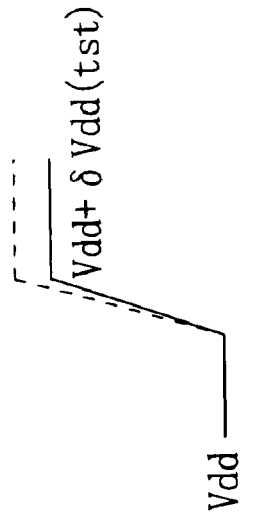
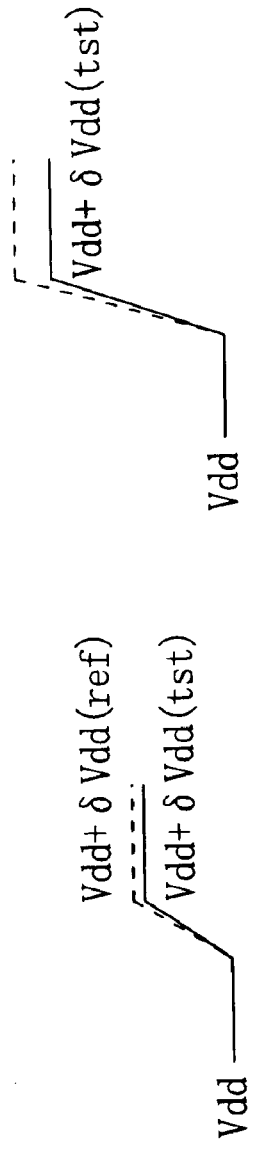
FIG. 24A  Larger Cm
FIG. 24B  Smaller Cm
FIG. 24C  Larger Cm
FIG. 24D  Smaller Cm FIG. 25A
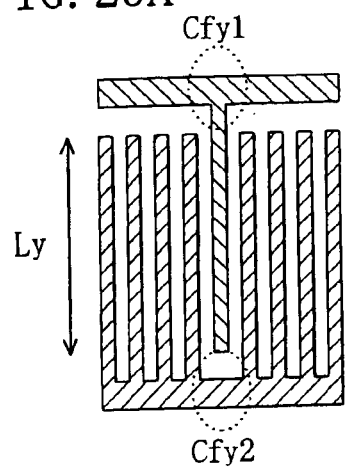
FIG. 25B
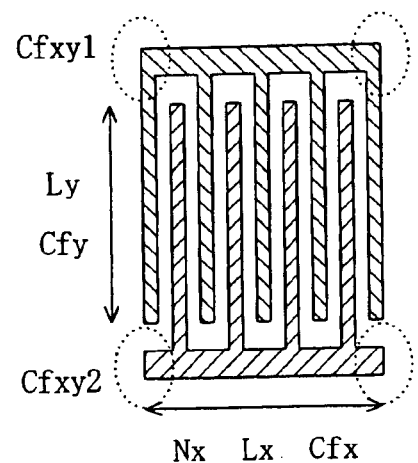
FIG. 26A
FIG. 26B
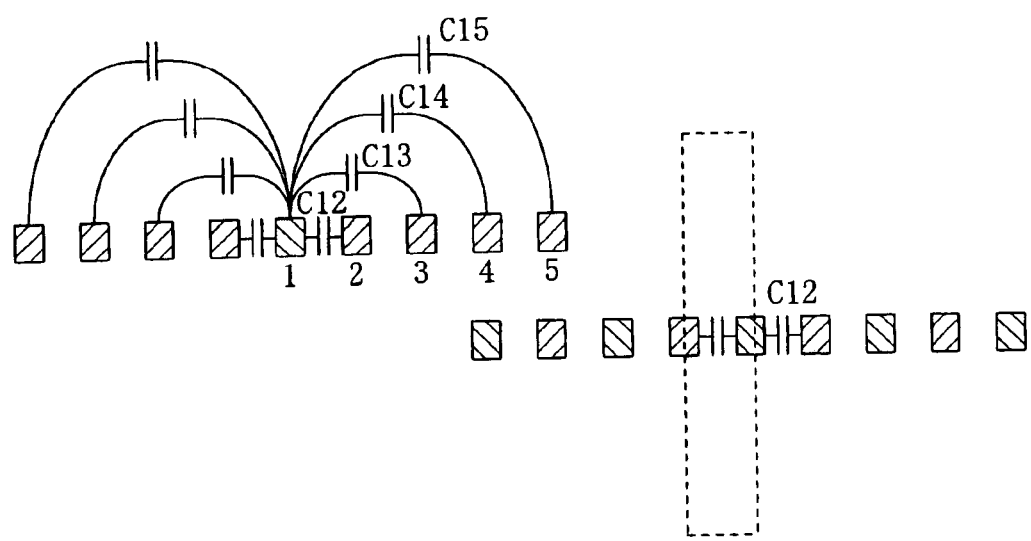
FIG. 27
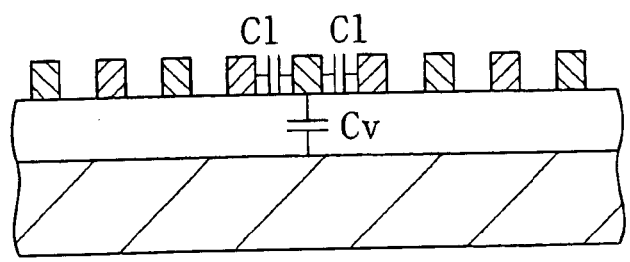

SEMICONDUCTOR DEVICE AND CAPACITANCE MEASUREMENT METHOD

BACKGROUND OF THE INVENTION

The present invention relates to a semiconductor device having a function of measuring various types of capacitance such as a line capacitance, a gate capacitance, and a junction capacitance.

In recent years, the ratio of the circuit delay to the line length due to the line capacitance has been increasing along with the increase in the density of a semiconductor device. At the same time, the variations in parameters defining a line have been increasing due to the variations in the manufacturing process conditions, or the like. As a result, the problem of the increasing variations in the circuit delay among semiconductor devices has become more pronounced, and it has become important to monitor variations in the line capacitance.

However, with the line capacitance measurement using a conventional LCR meter, it is necessary to provide a TEG pattern having a large area in order to maintain a desirable measurement precision, and thus it has been difficult to monitor the line capacitance variations in a product chip.

Chen, James C., et al., have developed a CBCM (Charge Based Capacitance Measurement) method as described in Proc. of IEDM 1996 pp. 69–72. With this method, the line capacitance is obtained in terms of current, and thus it is possible to measure the capacitance of a minute line. Therefore, the area of the TEG pattern is reduced. This has made it easy to provide a CBCM measurement circuit pattern in a scribe region, thereby making it possible to monitor the line capacitance variations in each product chip.

Furthermore, it is expected that the CBCM method will make it possible to measure very minute capacitances as follows, which could not be measured in the prior art:

(A) the capacitance of a single contact, the capacitance of a single intersection (cross) between lines, the input/output capacitance of a standard cell;

(B) the capacitance of a single DRAM cell; and (C) the bit line capacitance connected to a single bit line of a DRAM/SRAM.

The measurement of the capacitance (A) is expected to enable high-precision checking of LPE (Layout Parameter Extraction) results, the measurement of the capacitance (B) is expected to enable optimization of the cell structure and the sense circuit configuration by obtaining statistical distribution data for the cell capacitance, and the measurement of the capacitance (C) is expected to enable optimization of the sense circuit configuration by obtaining matching data for the bit line capacitance.

On the other hand, the evaluation of the gate length of a MIS transistor has been performed by an S & R method (Shift and Ratio method; see Reference 1 (IEEE Electron Device Lett, vol. 13, p. 267, 1992)), or the like, in view of the Id-Vg characteristics of a transistor.

While the S & R method is based on the assumption that the channel resistance is proportional to the channel length, the process of a generation where the design rule is 0.1 $\mu$m or less has an increased gate leak due to the reduction in the thickness of the gate oxide film and an increased mobility deterioration due to the increase in the concentration of the substrate in a pocket device, and these phenomena are dependent on the gate length. Therefore, it is becoming less likely that such an assumption holds true, thereby making it difficult to use the S & R method.

Moreover, a method for evaluating the gate length based on the measurement of the gate capacitance is described in Reference 2 (IEEE Electron Device Lett, vol. 5, p. 491, 1984). However, with capacitance measurement using a conventional LCR meter, as with line capacitance measurement, it is necessary to provide a TEG pattern having a large area in order to maintain a desirable measurement precision, whereby it is difficult to use the method for product chips.

As described above, a CBCM pattern is expected to be used for monitoring variations in the gate length because it makes it possible to measure a minute capacitance while reducing the area of the TEG pattern.

FIG. 21 is a block circuit diagram schematically illustrating a circuit configuration of a measurement device for measuring the line capacitance of a semiconductor device using a conventional CBCM method. As illustrated in the figure, the CBCM measurement device includes PMIS transistors MP1 and MP2 and NMIS transistors MN1 and MN2. The PMIS transistor MP1 and the PMIS transistor MP2 have mask dimensions with an equal gate length and an equal gate width, while the NMIS transistor MN1 and the NMIS transistor MN2 have mask dimensions with an equal gate length and an equal gate width.

Moreover, the measurement device further includes a pad NW for supplying a body voltage to the active region of the PMIS transistors MP1 and MP2, a pad Ref for supplying a power supply voltage Vdd to the source of the PMIS transistor MP1, a pad Gp for supplying a control voltage to the respective gates of the PMIS transistors MP1 and MP2, a pad Tst for supplying the power supply voltage Vdd to the source of the PMIS transistor MP2, a pad Gn for supplying a control voltage (control signal) to the respective gates of the NMIS transistors MN1 and MN2, and a pad Gnd for supplying a ground voltage Vss to the respective sources and the active region of the NMIS transistors MN1 and MN2.

The CBCM measurement device has a reference capacitance Cref between a node N1 (which is connected to the respective drains of the PMIS transistor MP1 and the NMIS transistor MN1) and the pad Gnd, and a test capacitance Ctst between a node N2 (which is connected to the respective drains of the PMIS transistor MP2 and the NMIS transistor MN2) and the pad Gnd. The reference capacitance Cref is equal to a dummy capacitance Cm, which is the capacitance of the drain contact, the line on the contact, etc., of each transistor. Note however that the dummy capacitance Cm does not include a drain junction capacitance Cj or a gate-drain capacitance Cgd of the transistor. The test capacitance Ctst is equal to the sum of the dummy capacitance Cm and a target capacitance Ct(=Cm+Ct).

Herein, the purpose of the measurement device is to measure the target capacitance Ct, which may be, for example, the capacitance of a line to be measured, the capacitance between the gate and the substrate, or the capacitance of a plug.

FIG. 22 is a timing chart illustrating the temporal transitions of the gate control signals supplied from the pads Gp and Gn to the respective transistors and the potential at the nodes N1 and N2 in the measurement device illustrated in FIG. 21.

Herein, the potential is fixed to the power supply voltage Vdd at the pads Ref, Tst and Nw, and the potential at the pad Gnd is fixed to the ground voltage Vss. As illustrated in the figure, the gate control signals supplied from the pads Gp and Gn to the gates of the transistors MP1, MP2, MN1 and MN2 transition so that one of the PMIS transistor MP1 and the NMIS transistor MN1 and one of the PMIS transistor MP2 and the NMIS transistor MN2 are ON at any time. Thus, the through current flowing from the PMIS transistor MP1 to the NMIS transistor MN1 and the through current flowing from the PMIS transistor MP2 to the NMIS transistor MN2 do not occur at the same timing.

As illustrated in FIG. 22, during the period between t1 and t2, the PMIS transistors MP1 and MP2 are both ON. Therefore, through currents I1 and I2 flow to charge the capacitors Cref and Ctst. During the same period, the NMIS transistors MN1 and MN2 are both OFF. Therefore, the respective potentials at the nodes N1 and N2, which are connected to the capacitors Cref and Ctst, respectively, both reach the power supply voltage Vdd.

On the other hand, during the period between t2 and t3, all of the transistors MP1, MP2, MN1 and MN2 are OFF. Ideally, it can be regarded that the charges stored in the capacitors Cref and Ctst are preserved. Therefore, the nodes N1 and N2 remain to be at the potential of the power supply voltage Vdd.

During the period between t3 and t4, only the NMIS transistors MN1 and MN2 are ON. Therefore, the capacitors Cref and Ctst are discharged, and the potentials at the nodes N1 and N2 reach the ground voltage Vss. On the other hand, during the period between t4 and t5, all of the transistors are OFF. Ideally, the capacitors Cref and Ctst remain to be at the potential Vss, i.e., the potential upon completion of the discharge process. The operation as described above is performed in one cycle, and the operation is repeated. The measurement device measures the time average value for the currents I1 and I2.

Herein, assuming that the frequency of the gate control signal supplied from each of the pads Gp and Gn is f(=1/T; T is the period of time from t1 to t5), Expression (1) below holds:

$$I2 - I1 = (Ctst \cdot Vdd/T) - (Cref \cdot Vdd/T) \quad (1)$$
$$= (Cm + Ct + Ctr - Cm - Ctr) \cdot Vdd/T$$
$$= (Ct \cdot Vdd \cdot f)$$

In Expression (1) above, Ctr is the capacitance connected to the drain terminal of a transistor, and the capacitance Ctr is equal to the sum of the drain junction capacitance Cj and the gate-drain overlap capacitance Cgd.

Based on Expression (1) above, the target capacitance Ct can be given by Expression (2) below:

$$Ct = (I2 - I1)/(Vdd \cdot f) \quad (2)$$

One advantage of the CBCM method is that it is possible to obtain the intended target capacitance Ct by canceling out the dummy capacitance and the parasitic capacitance of the transistor as shown in Expression (1). Note however that this method has error factors as follows.

Error Factors of CBCM Method

As disclosed in Reference 2 (Proc. of IEDM 1996 pp. 69–72), the error factors of the CBCM method include: 1) an error due to the poor precision of the measurement device; and 2) a mismatch between a pair of transistors, and these errors occur due to the following causes.

1) Specifically, the precision of the measurement device includes the precisions of the voltage source and the ammeter connected to the pads Ref and Tst, and the precision of the frequency of the pulse generator connected to the pads Gp and Gn.

2) Specifically, the mismatch between a pair of transistors means that although the PMIS transistors MP1 and MP2, and the NMIS transistors MN1 and MN2, are equally-sized in terms of the mask, they may differ from each other in terms of the junction capacitance, the gate-drain overlap capacitance, etc., due to the variations in the process conditions.

Moreover, as shown in Expression (1) above, the mismatch in the parasitic capacitance between a pair of transistors is one factor that determines the measurement precision. Note that in Reference 2, the error 2) is estimated to be 30 aF or less.

Moreover, beside the error 2), another process-related error is 3) the leak component of a transistor during an OFF period.

3) Specifically, the transistor leak components during an OFF period includes the OFF leak current of the NMIS transistors, the OFF leak current of the PMIS transistors, the tunneling current between the gate and the substrate, and the junction leak current, which may occur during the period between t4 and t5, during which all of the transistors illustrated in FIG. 22 are OFF. When these leak components are large, the potentials at the nodes N1 and N2 are floating up from the ideal potential Vss that is reached upon completion of a discharge process, whereby the nodes N1 and N2 are charged with a potential difference that is smaller than Vdd−Vss, thereby reducing the evaluated capacitance value.

However, when the CBCM method is used for
(1) measuring a very minute capacitance;
(2) monitoring the line capacitance variations;
(3) measuring the input/output capacitance of a standard cell or the DRAM/SRAM bit line capacitance; and
(4) monitoring the gate length variations, the following problems arise.

(1) Problem with Very Minute Capacitance Measurement

During the period between t4 and t5 as illustrated in FIG. 22 ("period A"), all of the transistors are OFF, and the nodes N1 and N2 ideally remain to be at the ground potential Vss. However, strictly speaking, the potentials at the nodes N1 and N2 fluctuate.

FIG. 23 is a more detailed version of the timing chart of FIG. 22. As illustrated in FIG. 23, during the period between t41 and t4, all of the transistors are OFF, and the potential at the pad Gn for turning the NMIS transistors MN1 and MN2 ON/OFF is falling, whereby the potentials at the nodes N1 and N2 are floating down from the ground potential Vss by δVss due to an undershoot. As a result, the nodes N1 and N2 are charged with a potential difference that is larger than Vdd−Vss, whereby the evaluated capacitance value is greater than the actual capacitance value. Moreover, during the period between t21 and t2, all of the transistors are OFF, and the potential at the pad Gp for turning the PMIS transistors MP1 and MP2 ON/OFF is rising, whereby the potentials at the nodes N1 and N2 are floating up from Vdd by δVdd due to an overshoot. As a result, the nodes N1 and N2 are charged with a potential difference that is larger than Vdd−Vss, whereby the evaluated capacitance value is greater than the actual capacitance value.

Moreover, during the period between t21 and t2, the potential at the pad Gp for turning the PMIS transistors MP1 and MP2 ON/OFF is rising, whereby a current flows into the PMIS transistors MP1 and MP2 via a gate-drain overlap capacitor. This also lowers the precision of the evaluated capacitance value.

Each of FIG. 24A to FIG. 24D shows a portion of the timing chart of FIG. 23 in an enlarged manner to illustrate a change in the voltage due to an overshoot. FIG. 24A and FIG. 24B illustrate the voltage at the node Ni (broken line) and the voltage at the node N2 (solid line), respectively, during the period between t40 and t5 illustrated in FIG. 23. FIG. 24C and FIG. 24D illustrate the voltage at the node N1 (broken line) and the voltage at the node N2 (solid line), respectively, during the period between t20 and t3 illustrated in FIG. 23.

As illustrated in FIG. 24A and FIG. 24B, the voltage decrease δVss from the ground potential is larger as the value of the dummy capacitance Cm is smaller. This is because an undershoot is due to the gate-drain overlap capacitor, which is a mirror capacitor, whereby the voltage decrease δVss is proportional to Cgd/(Cm+Ct+Cj+Cgd).

Moreover, as illustrated in FIG. 24C and FIG. 24D, the value of δVdd is larger as the value of the dummy capacitance Cm is smaller. This is because the voltage increase δVdd due to an overshoot is proportional to Cgd/(Cm+Ct+Cj+Cgd).

Since the absolute value of the current flowing in a PMIS transistor is proportional to δVdd, the absolute value of the current value I1 of the reference transistor is larger than the absolute value of the current value I2 of the target transistor.

Moreover, in a discharge operation, the sign of the current is opposite to that in a charge operation, whereby the relationship I2>I1 holds as in a charge operation. This means an apparent increase in the evaluated capacitance value.

With the problem (1) as described above, the evaluated capacitance value apparently increases if there is a large voltage increase/decrease due to an overshoot/undershoot of the potentials at the nodes N1 and N2 caused by the gate-drain overlap capacitance.

(2) Problem with Monitoring of Line Capacitance Variations

FIG. 25A and FIG. 25B are plan views illustrating different types of line patterns to be evaluated. FIG. 26A and FIG. 26B illustrate different types of line capacitance components between lines in the same wiring layer. FIG. 27 illustrates different types of line capacitance components, taking into consideration not only the capacitance between two lines in the same wiring layer but also the capacitance with a line in a different wiring layer or with the substrate.

As illustrated in FIG. 25A and FIG. 25B, line patterns to be evaluated are generally classified into two types, i.e., a single line pattern as illustrated in FIG. 25A and a periodic L/S pattern (line and space pattern) as illustrated in FIG. 25B. As illustrated in FIG. 26A, in a single line pattern, all the lines other than the subject line to be evaluated are grounded, whereby the capacitance of the subject line is obtained by summing up the capacitance C12 between the subject line and an adjacent line together with capacitances C13, C14, C15, ..., between the subject line and other lines. Moreover, as illustrated in FIG. 25B, a periodic L/S pattern includes two comb-shaped patterns meshed with each other. With a periodic L/S pattern, every other line is given a potential, and there is a potential distribution symmetry at opposing edges of the boundary shown in FIG. 26B. Therefore, a periodic L/S pattern is advantageous in that the analysis in a capacitance simulation is easy.

When measuring a line capacitance in an actual semiconductor integrated circuit device, the structure of the bus line or the bit line is closer to that shown in FIG. 25B, but the pattern illustrated in FIG. 25A generally accounts for the majority of cases. The patterns illustrated in FIG. 25A and FIG. 25B both aim at obtaining a capacitance per unit length while taking into consideration only the two-dimensional cross-sectional area.

However, it is difficult to use the CBCM method for measuring the capacitance of a pattern illustrated in FIG. 25A or FIG. 25B for the following reason. Since a CBCM pattern is based on the assumption that it is to be provided in a scribe region, the pattern has a reduced area. As a result, the pattern is significantly shifted from the shape with which it is only necessary to take into consideration the ideal two-dimensional cross-sectional area of the line, and this shift causes an error in the measured line capacitance value.

For example, an error is caused by a fringe capacitance component due to the three-dimensional shape of capacitors Cfy1 or Cfy2 illustrated in FIG. 25A or capacitors Cfx, Cfy, Cfxy1 or Cfxy2 illustrated in FIG. 25B.

Furthermore, the line capacitance component includes, in addition to the line capacitance C1 between lines in the same wiring layer, a capacitance Cv between the subject line and a line in another wiring layer, as illustrated in FIG. 27. However, it is not easy in the prior art to separate such a line capacitance component in a certain line pattern.

(3) Problem with Measurement of Input/Output Capacitance of Standard Cell, or the Like.

The input/output capacitance of a standard cell or the bit line capacitance of a DRAM/SRAM both include capacitance components with voltage dependence such as the gate capacitance and the junction capacitance, in addition to the line capacitance. Therefore, whether or not such a capacitance can be evaluated with a high precision is dependent on whether or not it is possible to evaluate the C-V characteristics (the voltage dependence of a capacitance).

FIG. 28 is a graph illustrating the gate voltage Vgb dependence of a gate capacitance Cgg, which is obtained by an HSPICE simulation and the CBCM method. Typically, in a transistor, the voltage Vgb applied between the gate and the substrate changes with the source, the drain and the substrate being shorted together. In the figure, the symbol "◊" (BSIM3) denotes data of a standard model included in the HSPICE simulation. On the other hand, the measurement by the CBCM method was performed as follows. The gate control signals from the pads Gp and Gn illustrated in FIG. 22 were input to a CBCM measurement device pattern, which is illustrated in FIG. 10A and will be described later, and the capacitance value was calculated based on Expression (2) by integrating the currents 11 and 12 flowing through the nodes N1 and N2, respectively.

The CBCM circuit simulation is performed by using a BSIM3 model. Therefore, the results of the CBCM circuit simulation should ideally coincide with those of the BSIM3 simulation. However, as can be seen from FIG. 28, the results are quite different from each other. Moreover, in the CBCM measurement, it is necessary to apply a power supply voltage Vdd that is equal to or greater than the threshold voltage of the transistor. Therefore, data is not obtained at all in a region where the gate voltage Vgb is low (0.5 or less in the figure). Also in a region where the gate voltage Vgb is high (0.7 or more in the figure), the capacitance value estimated by using the CBCM method is smaller than the ideal BSIM3 capacitance value.

(4) Problem with Monitoring of Gate Length Variations

The process of a generation where the design rule is 0.1 μm or less has an increased gate leak due to the reduction in the thickness of the gate oxide film. With the measurement by a conventional LCR method, the conductance component of the gate leak is as large as the capacitance component ωC (=2πfC), thereby resulting in a large capacitance measurement error.

In the CBCM method, the proportion of the gate leak with respect to the measured current can be relatively reduced by increasing the measurement frequency f. However, when externally applying a gate control signal as illustrated in FIG. 22, there is an upper limit for the measurement frequency f. Moreover, while the measurement device itself is capable of operating with a frequency ranging from a frequency on the order of 10 MHz to a frequency of 100 MHz, the resonance frequency is on the order of MHz in the measurement system (particularly the coaxial signal line). Therefore, taking some margin into consideration, the upper limit for the measurement frequency is about 1 MHz. Thus, it is difficult to remove the influence of the gate leak from the measured capacitance value.

SUMMARY OF THE INVENTION

An object of the present invention is to provide a semiconductor device and a capacitance measurement method with which it is possible to suppress at least one of the problems (1), (2), (3) and (4) set forth above.

A semiconductor device of the present invention includes a capacitance measurement circuit provided in a portion of a semiconductor substrate, the capacitance measurement circuit including a reference circuit and a test circuit, wherein: the reference circuit includes: a reference series circuit including two reference switching elements connected in series with each other via a first node therebetween, the two reference switching elements being turned ON/OFF at different timings from each other; a pair of first voltage supply sections for supplying two voltages, one being higher than the other, respectively to opposite ends of the reference series circuit; a first reference conductor section connected to the first node; and a second reference conductor section, with a dummy capacitor being formed between the first reference conductor section and the second reference conductor section, and the dummy capacitor having a dummy capacitance; the test circuit includes: a test series circuit including two test switching elements connected in series with each other via a second node therebetween, the two test switching elements being turned ON/OFF at different timings from each other; a pair of second voltage supply sections for supplying two voltages, one being higher than the other, respectively to opposite ends of the test series circuit; a first test conductor section connected to the second node; and a second test conductor section, with a test capacitor being formed between the first test conductor section and the second test conductor section, and the test capacitor having a test capacitance that can be represented by a sum of the dummy capacitance and a target capacitance; and the semiconductor device further includes voltage suppression means for suppressing an amount of voltage change due to an overshoot or an undershoot in each of the switching elements of the capacitance measurement circuit.

In this way, it is possible to suppress the amount of voltage fluctuation at the first and second nodes due to an undershoot or an overshoot occurring when switching the transistors ON/OFF, whereby it is possible to obtain a semiconductor device with a high capacitance measurement precision.

In one embodiment of the present invention, the voltage suppression means is first voltage control means for setting the first reference conductor section and the first test conductor section so that the dummy capacitance is ten times or more as much as a gate-drain overlap capacitance of each of the switching elements. In this way, the function of suppressing the amount of voltage fluctuation at the first and second nodes is improved.

In one embodiment of the present invention, in each of the series circuits, the two switching elements are a P-channel MIS transistor provided on a higher-voltage side and an N-channel MIS transistor provided on a lower-voltage side; and the voltage suppression means is second voltage control means such that a gate width of the P-channel MIS transistor is larger than that of the N-channel MIS transistor so that the P-channel MIS transistor and the N-channel MIS transistor have the same drivability. In this way, it is possible to suppress an undershoot or an overshoot occurring when switching the transistors ON/OFF, which is significantly dependent also on the drivability of the transistors. Thus, it is possible to obtain a semiconductor device with a high capacitance measurement precision.

In one embodiment of the present invention, the voltage suppression means is third voltage control means such that one cycle of a switching operation of each of the series circuits includes a total of eight periods including one period in which both switching elements are OFF, four periods in which either one switching element rises or falls, one period in which both switching elements are ON, and two periods in which one switching element is ON and the other switching element is OFF, each of the four periods in which either one switching element rises or falls being set to exceed ⅛ of the one cycle. In this way, the slew rate when switching the transistors ON/OFF can be reduced, whereby it is possible to suppress the undershoot or the overshoot. Thus, it is possible to obtain a semiconductor device with a high capacitance measurement precision.

In one embodiment of the present invention, the voltage suppression means is fourth voltage control means such that the dummy capacitance is twice or more as much as the target capacitance. In this way, it is possible to suppress the amount of voltage fluctuation at the first and second nodes due to an undershoot or an overshoot occurring when switching the transistors ON/OFF, whereby it is possible to obtain a semiconductor device with a high capacitance measurement precision.

It is preferred that the dummy capacitance is the target capacitance times N (N is an integer equal to or greater than one); the test capacitance is the target capacitance times M (M is an integer greater than one); and M>N.

In one embodiment of the present invention, M=N+1. In this way, the overshoot and undershoot characteristics can be made approximate to each other, whereby it is possible to obtain a semiconductor device with an even higher capacitance measurement precision.

In one embodiment of the present invention, M≧N+2. In this way, the variations in the target capacitance due to the variations in the shape of the actually patterned line are averaged. Therefore, it is possible to reduce the capacitance measurement error due to the variations in the process conditions, or the like.

In one embodiment of the present invention, the semiconductor device further includes a triple-well region provided in the semiconductor substrate, wherein: the first test conductor section extends over the triple-well region; and a voltage of the triple-well region can be controlled independently of turning ON/OFF of the switching transistors. In this way, it is possible to obtain a semiconductor device having a function of measuring the voltage dependence of a capacitance that has a voltage dependence such as a MIS capacitance.

In one embodiment of the present invention, the semiconductor device further includes a control circuit for generating a control signal for turning the switching transistors ON/OFF at different timings from each other. In this way, it is possible to obtain a semiconductor device with which a minute capacitance can be measured simply by supplying a power supply voltage and a ground voltage to the semiconductor device.

In one embodiment of the present invention, the semiconductor device further includes a frequency divider provided on the semiconductor substrate and connected to the control circuit for dividing a frequency of an output signal of the control circuit. In this way, it is possible to precisely measure the target capacitance of a test capacitor that includes minute elements with a C-V method using a high-frequency control voltage, while precisely measuring the frequency that is required for calculating the capacitance based on the divided frequency. Thus, it is possible to obtain a semiconductor device with a high capacitance measurement precision.

Another semiconductor device of the present invention includes a capacitance measurement circuit provided in a portion of a semiconductor substrate, the capacitance measurement circuit including: first to fourth series circuits each including two switching elements connected in series with each other via a first node therebetween, the two switching elements being turned ON/OFF at different timings from each other; a pair of voltage supply sections provided for each of the series circuits for supplying two voltages, one being higher than the other, respectively to opposite ends of the series circuit; and four capacitors connected to respective nodes of the series circuits, each of the four capacitors including a first comb-shaped line having a plurality of comb-tooth-shaped portions and a base portion supporting the comb-tooth-shaped portions, and a second comb-shaped line having a plurality of comb-tooth-shaped portions and a base portion supporting the comb-tooth-shaped portions, the comb-tooth-shaped portions of the second comb-shaped line being meshed with those of the first comb-shaped line, wherein the four capacitors respectively have the following combinations of the number N of comb teeth and a length L by which the comb teeth are meshed with each other: (Nx, Ly), (Nx, Ly'), (Nx', Ly) and (Nx', Ly') (Nx<Nx', Lx<Lx').

In this way, the three-dimensional fringe components can easily be canceled out, whereby it is possible to precisely obtain the two-dimensional line capacitance per unit length.

In one embodiment of the present invention, the semiconductor device further includes a dummy line of a line-and-space pattern provided around each of the capacitors. In this way, the capacitance densities of the four capacitors at various portions of the line pattern can be made uniform, and thus the final dimensions of the line pattern can be made substantially uniform.

Still another semiconductor device of the present invention includes a capacitance measurement circuit provided in a portion of a semiconductor substrate, the capacitance measurement circuit including: a first series circuit including two switching elements connected in series with each other via a first node therebetween, the two switching elements being turned ON/OFF at different timings from each other; a second series circuit including two switching elements connected in series with each other via a second node therebetween, the two switching elements being turned ON/OFF at different timings from each other; a pair of voltage supply sections for supplying two voltages, one being higher than the other, respectively to opposite ends of each of the first and second series circuits; a first conductor section connected to the first node; a second conductor section connected to the second node, with a first capacitor being formed between the first conductor section and the second conductor section; and control means for separately turning ON/OFF the switching elements of the first and second series circuits, wherein a second capacitor is formed between the semiconductor substrate and the first and second conductor sections.

In this way, it is possible to obtain a semiconductor device having a function of easily and separately measuring the capacitance between two lines in the same wiring layer and the capacitance between a line in a wiring layer and a conductive layer in another layer.

Still another semiconductor device of the present invention includes a capacitance measurement circuit provided in a portion of a semiconductor substrate, the capacitance measurement circuit including a reference circuit and a test circuit, wherein: the reference circuit includes: a reference series circuit including two reference switching elements connected in series with each other via a first node therebetween, the two reference switching elements being turned ON/OFF at different timings from each other; a pair of first voltage supply sections for supplying two voltages, one being higher than the other, respectively to opposite ends of the reference series circuit; a first reference conductor section connected to the first node; and a second reference conductor section, with a dummy capacitor being formed between the first reference conductor section and the second reference conductor section, and the dummy capacitor having a dummy capacitance; the test circuit includes: a test series circuit including two test switching elements connected in series with each other via a second node therebetween, the two test switching elements being turned ON/OFF at different timings from each other; a pair of second voltage supply sections for supplying two voltages, one being higher than the other, respectively to opposite ends of the test series circuit; and a test capacitor including a first comb-shaped line having a plurality of comb-tooth-shaped portions and a base portion, and a second snake-shaped line meshed with the comb-tooth-shaped portions of the first comb-shaped line, with one of the first line and the second line being connected to the second node.

In this way, it is possible to measure the resistance value of the second snake-shaped line, and to correct the measured capacitance value using the line dimension that is obtained based on the resistance value. Thus, it is possible to obtain a semiconductor device with an even higher capacitance measurement precision.

It is preferred that the semiconductor device further includes a capacitor provided between the second node and a ground and in parallel to the test capacitor, the capacitor having a capacitance that is substantially equal to the dummy capacitance of the dummy capacitor.

In a case where the pattern to be evaluated is a gate to be evaluated, the first dimension is a gate width and the second dimension is a gate length.

Still another semiconductor device of the present invention includes a capacitance measurement circuit provided in a portion of a semiconductor substrate, the capacitance measurement circuit including: a first series circuit including two switching elements connected in series with each other via a first node therebetween, the two switching elements being turned ON/OFF at different timings from each other; a second series circuit including two switching elements connected in series with each other via a second node therebetween, the two switching elements being turned ON/OFF at different timings from each other; a third series circuit including two switching elements connected in series with each other via a third node therebetween, the two switching elements being turned ON/OFF at different timings from each other; a pair of voltage supply sections for supplying two voltages, one being higher than the other, respectively to opposite ends of each of the series circuits; a pattern to be evaluated, which includes a target capacitance connected to the first node, the pattern to be evaluated having a width in a first direction equal to a first dimension and a width in a second direction equal to a second dimension; a first sample pattern connected to the second node, the first sample pattern having a width in the first direction equal to the first dimension and a width in the second direction equal to a third dimension that is greater than the second dimension; and a second sample pattern connected to the third node, the second sample pattern having a width in the first direction equal to the first dimension and a width in the second direction equal to a fourth dimension that is greater than the third dimension.

In this way, it is possible to precisely obtain the dimensions of elements forming a test capacitor in the pattern to be evaluated by an extrapolation operation by using the first and second sample patterns, whereby it is possible to correct a capacitance measurement result based on the actual dimensions. Thus, it is possible to obtain a semiconductor device with a high capacitance measurement precision.

A capacitance measurement method of the present invention is a method for measuring a capacitance of a semiconductor device including a capacitance measurement circuit provided in a portion of a semiconductor substrate, the capacitance measurement circuit including: a reference circuit including a reference series circuit that includes a first P-channel transistor and a first N-channel transistor connected in series with each other via a first node therebetween between a high-potential side voltage supply section and a low-potential side voltage supply section, a first reference conductor section connected to the first node, and a second reference conductor section, with a dummy capacitor being formed between the first reference conductor section and the second reference conductor section; and a test circuit including a test series circuit that includes a second P-channel transistor and a second N-channel transistor connected in series with each other via a second node therebetween between a high-potential side voltage supply section and a low-potential side voltage supply section, a first test conductor section connected to the second node, and a second test conductor section, with a test capacitor being formed between the first test conductor section and the second test conductor section, the method including the steps of (a) supplying a first control voltage to the first and second P-channel transistors at substantially the same timing; and (b) supplying a second control voltage to the first and second N-channel transistors at substantially the same timing, wherein a maximum voltage of the second control is substantially equal to a voltage of the high-potential side voltage supply section and is smaller than a maximum voltage of the first control voltage, and a minimum voltage of the second control is a negative voltage.

With this method, it is possible to obtain the capacitance of the test capacitor based on the difference between the current flowing through the first node and that flowing through the second node by using an approximate expression. Thus, it is possible to obtain a semiconductor device with which it is possible to easily and relatively precisely measure the voltage dependence of a capacitance.

It is preferred that the semiconductor device further includes a triple-well region provided in the semiconductor substrate; the first test conductor section extends over the triple-well region; and a voltage of the triple-well region is controlled independently of turning ON/OFF of the switching transistors.

Another capacitance measurement method of the present invention is a method for measuring a capacitance of a semiconductor device including: a first series circuit including two switching elements connected in series with each other via a first node therebetween, the two switching elements being turned ON/OFF at different timings from each other; a second series circuit including two switching elements connected in series with each other via a second node therebetween, the two switching elements being turned ON/OFF at different timings from each other; a third series circuit including two switching elements connected in series with each other via a third node therebetween, the two switching elements being turned ON/OFF at different timings from each other; a pair of voltage supply sections for supplying two voltages, one being higher than the other, respectively to opposite ends of each of the series circuits; a pattern to be evaluated, which forms an evaluated pattern capacitance including a target capacitance connected to the first node, the pattern to be evaluated having a width in a first direction equal to a first dimension and a width in a second direction equal to a second dimension; a first sample pattern forming a first sample capacitance connected to the second node, the first sample pattern having a width in the first direction equal to the first dimension and a width in the second direction equal to a third dimension that is greater than the second dimension; and a second sample pattern forming a second sample capacitance connected to the third node, the second sample pattern having a width in the first direction equal to the first dimension and a width in the second direction equal to a fourth dimension that is greater than the third dimension, the method including the steps of: (a) measuring the first and second sample capacitances of the first and second sample patterns; (b) producing a characteristic line representing a mask dimension dependence of at least the first and second sample capacitances; (c) measuring the evaluated pattern capacitance of the pattern to be evaluated; and (d) determining the second dimension of the pattern to be evaluated based on the evaluated pattern capacitance on the characteristic line produced in the step (b).

In this way, it is possible to precisely obtain the actual dimensions of elements forming a test capacitor by using an extrapolation operation.

In one embodiment of the present invention, the method further includes the steps of obtaining a parasitic capacitance that is not dependent on a mask dimension from the characteristic line produced in the step (b), and obtaining the target capacitance of the pattern to be evaluated by subtracting the parasitic capacitance from the evaluated pattern capacitance. In this way, the capacitance measurement precision is further improved.

BRIEF DESCRIPTION OF THE DRAWINGS

FIG. 4 shows one cycle of a measurement process by a CBCM method as illustrated in FIG. 23.

Figure 23:
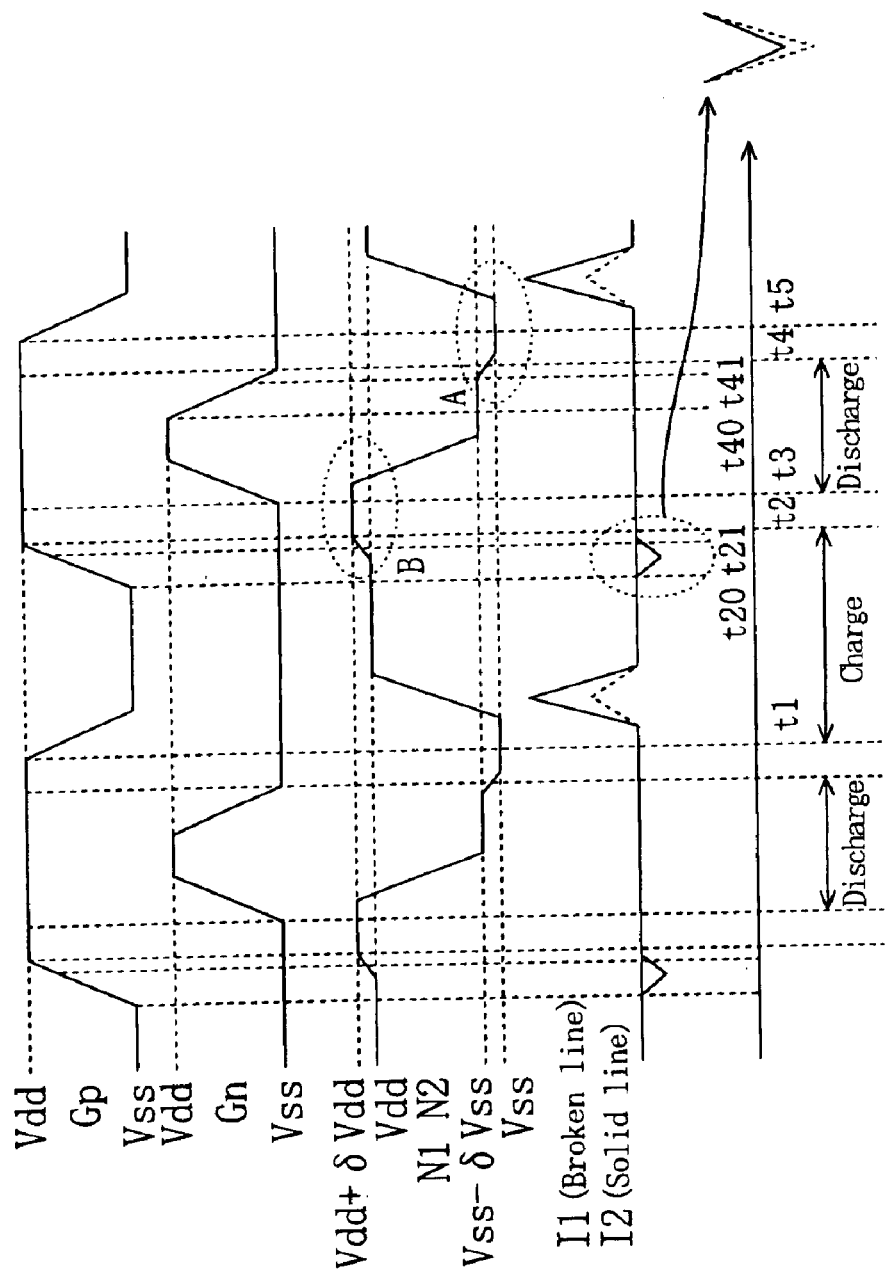
FIG. 23 is a more detailed version of the timing chart of FIG. 22.

Each of FIG. 24A to FIG. 24D shows a portion of the timing chart of FIG. 23 in an enlarged manner to illustrate a change in the voltage due to an overshoot.

FIG. 25A and FIG. 25B are plan views illustrating different types of line patterns to be evaluated.

FIG. 26A and FIG. 26B illustrate different types of line capacitance components between lines in the same wiring layer.

FIG. 27 illustrates different types of line capacitance components, taking into consideration not only the capacitance between two lines in the same wiring layer but also the capacitance with a line in a different wiring layer or with the substrate.

Figure 28:
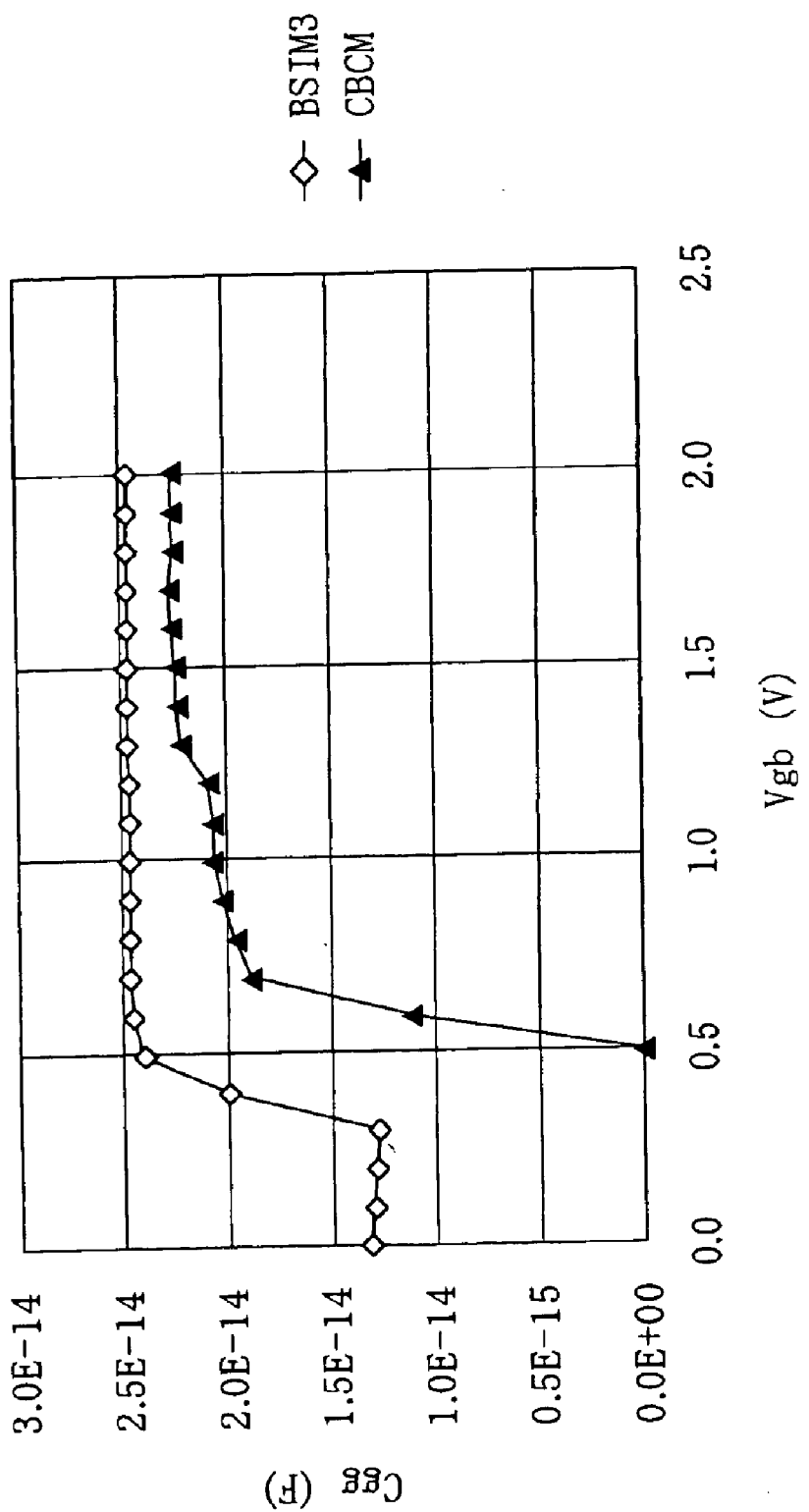

FIG. 28 is a graph illustrating the gate voltage Vgb dependence of a gate capacitance Cgg, which is obtained by an HSPICE simulation and the CBCM method.

Figure 29:
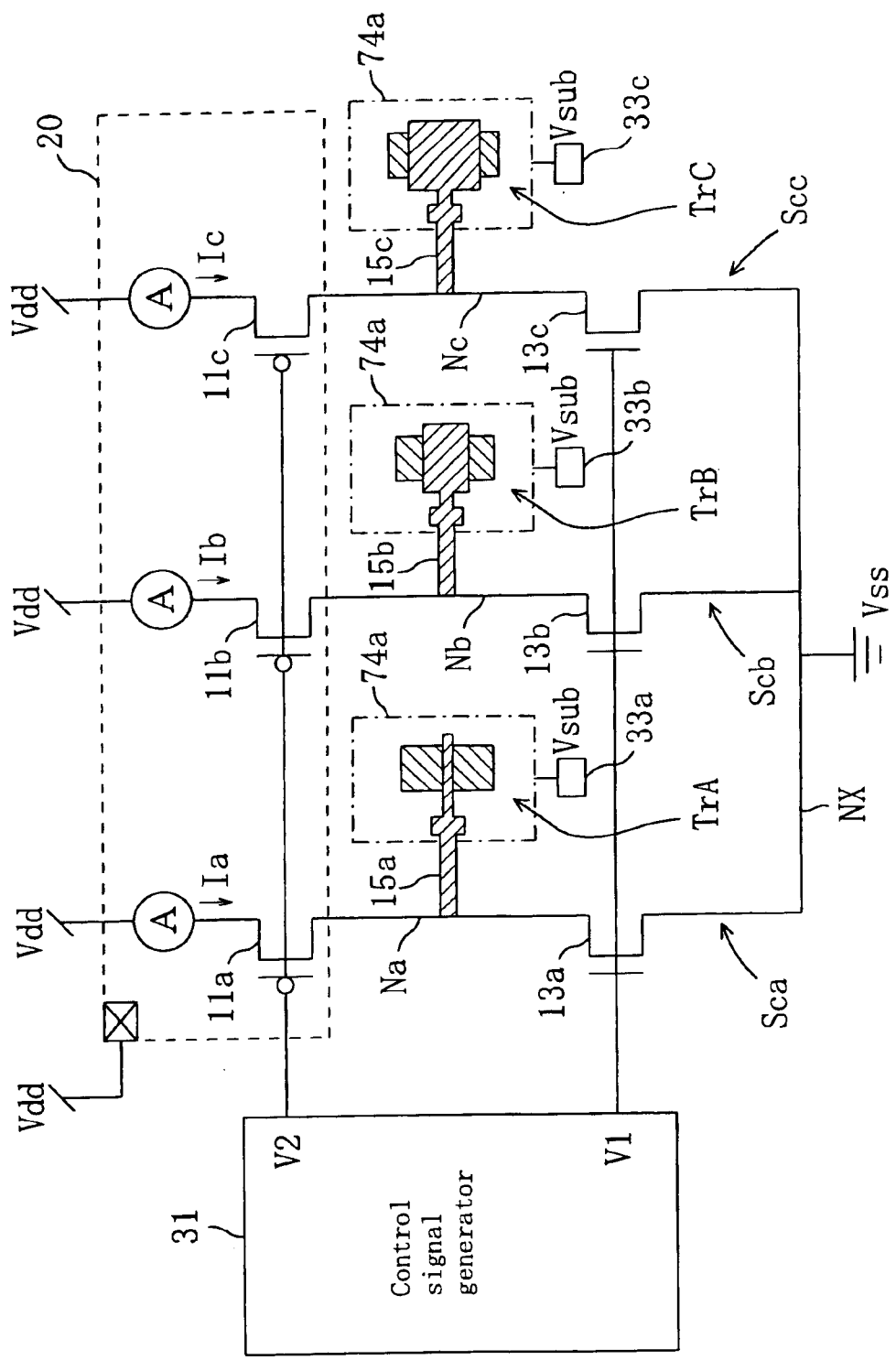

FIG. 29 is a block circuit diagram schematically illustrating a circuit configuration of a CBCM measurement device used in a variation of the seventh embodiment of the present invention.

DESCRIPTION OF THE PREFERRED EMBODIMENTS

First Embodiment

Figure 1:
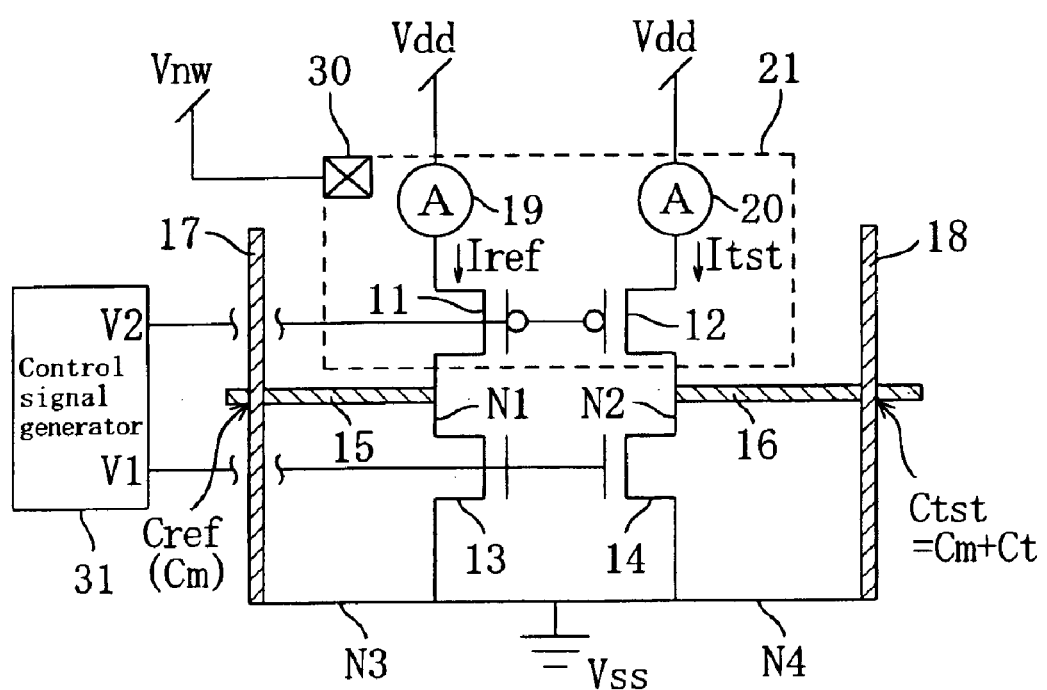
FIG. 1 is a block circuit diagram schematically illustrating a circuit configuration of a CBCM measurement device used in the first embodiment of the present invention.

FIG. 1 is a block circuit diagram schematically illustrating a circuit configuration of a CBCM measurement device (a semiconductor device of the present invention) used in the first embodiment of the present invention.

As illustrated in the figure, the CBCM measurement device of the present invention includes a reference PMIS transistor 11, a test PMIS transistor 12, a reference NMIS transistor 13, and a test NMIS transistor 14. The reference PMIS transistor 11 and the test PMIS transistor 12 have mask dimensions with an equal gate length and an equal gate width, while the reference NMIS transistor 13 and the test NMIS transistor 14 have mask dimensions with an equal gate length and an equal gate width. The semiconductor device of the present invention is more often placed in a scribe region than in a chip area on a semiconductor substrate (wafer).

The reference PMIS transistor 11 and the reference NMIS transistor 13 are arranged in series with each other between a terminal (pad) for supplying the power supply voltage Vdd and another terminal (pad) for supplying the ground voltage Vss. Thus, the power supply voltage Vdd is supplied to the source of the reference PMIS transistor 11, and the ground voltage Vss is supplied to the source of the reference NMIS transistor 13. The drain of the reference PMIS transistor 11 and the drain of the reference NMIS transistor 13 are connected to each other via a common first node N1.

The test PMIS transistor 12 and the test NMIS transistor 14 are arranged in series with each other between a terminal (pad) for supplying the power supply voltage Vdd and another terminal (pad) for supplying the ground voltage Vss. Thus, the power supply voltage Vdd is supplied to the source of the test PMIS transistor 12, and the ground voltage Vss is supplied to the source of the test NMIS transistor 14. The drain of the test PMIS transistor 12 and the drain of the test NMIS transistor 14 are connected to each other via a common second node N2.

Moreover, a pad 30 for supplying a body voltage Vnw is provided in an active region 21 of the PMIS transistors 11 and 12.

Furthermore, the CBCM device includes a first reference conductor section 15 connected to the first node N1, a first test conductor section 16 connected to the second node N2, a second reference conductor section 17, and a second test conductor section 18. The first reference conductor section 15 and the second reference conductor section 17 together form a capacitor (reference capacitance Cref) with an insulating layer interposed therebetween. The first test conductor section 16 and the second test conductor section 18 together form a capacitor (test capacitance Ctst) with an insulating layer interposed therebetween. The second reference conductor section 17 and the second test conductor section 18 are grounded via a third node N3 and a fourth node N4, respectively. In many cases, the third and fourth nodes N3 and N4 are actually portions of the substrate.

Furthermore, the CBCM device includes a control signal generator 31, which is means for generating a control signal for turning the transistors ON/OFF. By using the control signal generator 31, a control voltage V1 is supplied to the gates of the reference NMIS transistor 13 and the test NMIS transistor 14, and a control voltage V2 to the gates of the reference PMIS transistor 11 and the test PMIS transistor 12.

Moreover, the CBCM device includes a reference current measurement pad 19 for measuring a reference current Iref flowing through the reference PMIS transistor 11, and a test current measurement pad 20 for measuring a test current Itst flowing through the test PMIS transistor 12.

Note that although FIG. 1 shows a configuration where the first reference conductor section 15 and the second reference conductor section 17 overlap with each other, while the first test conductor section 16 and the second test conductor section 18 overlap with each other, the elements 15 to 18 may alternatively be provided all in the same wiring layer because it is only necessary to form a capacitor between the elements 15 and 17 and between the elements 16 and 18. Specifically, it is possible to measure the capacitance between lines, the capacitance between the gate electrode and the substrate, and a capacitance between plugs.

Depending on how control voltages are supplied, the reference transistors, or the test transistors, may be both N-channel transistors or both P-channel transistors.

The configuration of the CBCM device of the present embodiment illustrated in FIG. 1 is basically the same as that of a conventional CBCM device.

In the present embodiment, the reference capacitance Cref is equal to the dummy capacitance Cm, which is the capacitance of the drain contact, the line on the contact, etc., of each transistor. Note however that the dummy capacitance Cm does not include the drain junction capacitance Cj or the gate-drain overlap capacitance Cgd of the transistor. Moreover, the test capacitance Ctst is equal to the sum of the dummy capacitance Cm and the target capacitance Ct (=Cm+Ct). The target capacitance Ct is, for example, a line capacitance. Note however that while the dummy capacitance Cm or the target capacitance Ct is not represented only by the capacitance between the first conductor section and the second conductor section, it is represented in a simplified manner in FIG. 1 for the purpose of illustration.

Figure 2A:
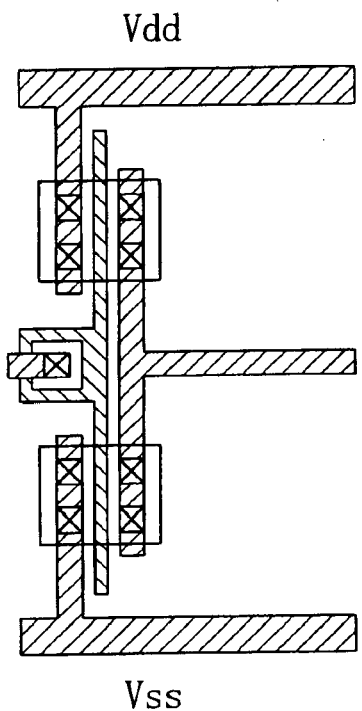
FIG. 2A and FIG. 2B illustrate a line pattern connected to transistors in a conventional CBCM device and that in the CBCM device of the present embodiment, respectively.
Figure 2B:
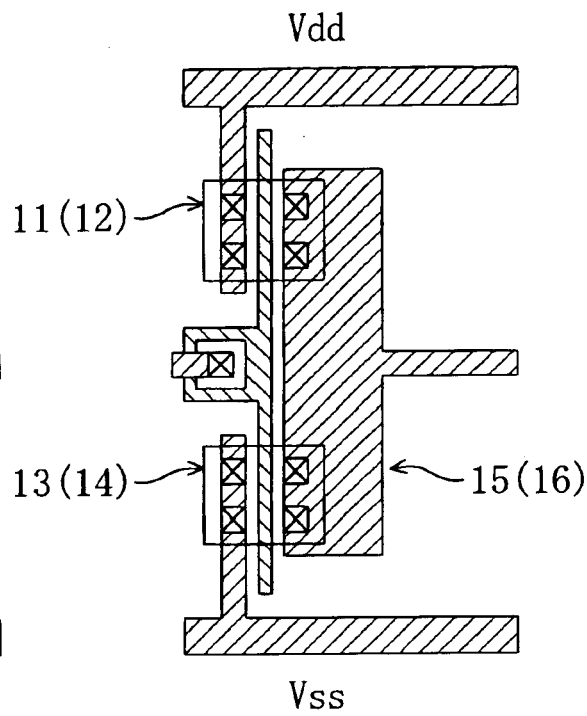

FIG. 2A and FIG. 2B illustrate a line pattern connected to transistors in the conventional CBCM device and that in the CBCM device of the present embodiment, respectively. As compared with the line pattern in the conventional CBCM device illustrated in FIG. 2A, in the present embodiment, the first conductor sections (the first reference conductor section 15 and the first test conductor section 16) both have a large area, as illustrated in FIG. 2B. Specifically, the sum of the target capacitance Ct and the dummy capacitance Cm (Ct+Cm) is about twice as much as the gate-drain overlap capacitance Cgd of each transistor in the conventional CBCM device, whereas Ct+Cm is ten times or more as much as Cgd in the present embodiment.

As already described above with reference to FIG. 24A to FIG. 24D, as the dummy capacitance Cm is larger, an overshoot or an undershoot is suppressed to be smaller, thereby suppressing the voltage increase δVdd due to an overshoot or the voltage decrease δVss due to an undershoot. Therefore, the measurement error is also suppressed to be small.

Figure 3:
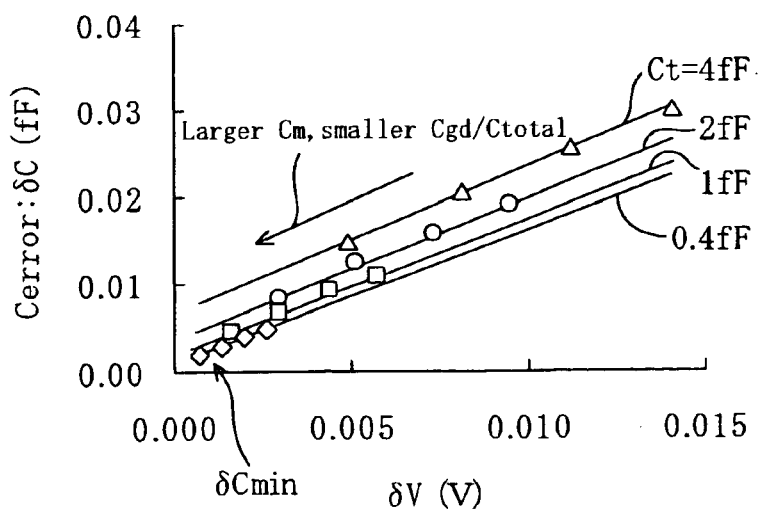
FIG. 3 is a graph illustrating the dummy capacitance dependence of a voltage change amount due to an overshoot or an undershoot, which causes a measurement error of a target capacitance.

FIG. 3 is a graph illustrating the dummy capacitance dependence of a voltage change amount δV (δVss or δVdd as described above) due to an overshoot or an undershoot, which causes a measurement error δC of the target capacitance. As illustrated in the figure, the measurement error δC is smaller as δV is smaller. Moreover, the voltage change amount δV due to the gate-drain overlap capacitance Cgd is smaller as the dummy capacitance Cm is larger or as the value obtained by dividing the gate-drain overlap capacitance Cgd by a total capacitance Ctotal (Cm+Ct+Cj+Cgd≈Cm+Ct) is smaller. Therefore, it can be seen that the measurement error δC of the target capacitance (line capacitance) is smaller as the dummy capacitance Cm is larger or as the Cgd/Ctotal is smaller.

A circuit simulation shows that by setting the sum of the target capacitance Ct and the dummy capacitance Cm to be ten times or more as much as the gate-drain overlap capacitance Cgd, it is possible to effectively suppress an overshoot or an undershoot and to maintain the voltage change amount δV to be small. Therefore, it is possible to suppress the measurement error δC of the target capacitance Ct such as a line capacitance when using the CBCM method, thereby improving the measurement precision, by setting the width of a line that corresponds to a dummy member (the first reference conductor section 15 and the first test conductor section 16 in the present embodiment) to be about ten times or more as much as that in the prior art (specifically, about 2 μm), as illustrated in FIG. 2B.

Moreover, it has been found from an analysis of simulation results that the voltage change amount δVss due to an undershoot and the voltage change amount δVdd due to an overshoot both have about the same degree of effect on the error factor of a measured capacitance. Therefore, the error in a measured capacitance can be minimized by setting the voltage change amount δVss due to an undershoot to be about the same as the voltage change amount δVdd due to an overshoot. An undershoot or an overshoot are not only dependent on the ratio between the gate-drain overlap capacitance Cgd and the sum of the target capacitance Ct and the dummy capacitance Cm, but also significantly dependent on the drivability of the transistor. Typically, the drivability of a PMIS transistor is about one half of that of an NMIS transistor. Therefore, the gate width of a PMIS transistor can be set to be about twice as much as that of an NMIS transistor. In this way, the drivability of the PMIS transistor is about the same as that of the NMIS transistor, whereby the voltage change amount δVdd due to an overshoot caused by the drivability of the NMIS transistor is about the same as the voltage change amount δVss due to an undershoot caused by the drivability of the PMIS transistor, thus minimizing the error in the measured capacitance.

Specifically, in the CBCM device illustrated in FIG. 1, it is preferred that the gate width of the PMIS transistors (the reference PMIS transistor 11 and the test PMIS transistor 12 in the present embodiment) is about twice as much as that of the NMIS transistors (the reference NMIS transistor 13 and the test NMIS transistor 14 in the present embodiment).

Next, FIG. 4 shows one cycle of a measurement process by the CBCM method as illustrated in FIG. 23. Herein, V2 is the control signal for the PMIS transistors 11 and 12, and V1 is the control signal for the NMIS transistors 13 and 14. As illustrated in the figure, one cycle of the CBCM measurement can be divided into eight periods P1 to P8. In the period P1, the PMIS transistors are ON while the NMIS transistors are OFF (charge operation period). In the period P2, the PMIS transistors rise while the NMIS transistors are OFF. In the period P3, the PMIS transistors and the NMIS transistors are both OFF. In the period P4, the PMIS transistors are OFF while the NMIS transistors rise. In the period P5, the PMIS transistors are OFF while the NMIS transistors are ON (discharge operation period). In the period P6, the PMIS transistors are ON while the NMIS transistors fall. In the period P7, the PMIS transistors and the NMIS transistors are both OFF. In the period P8, the PMIS transistors rise while the NMIS transistors are OFF. In other words, there are four states as follows:

(1) a steady state where the NMIS transistors are ON while the PMIS transistors are OFF (discharge operation): the period P5

(2) a steady state where the NMIS transistors are OFF while the PMIS transistors are ON (charge operation): the period P1

(3) a steady state where both transistors are OFF: the periods P3 and P7

(4) a transitional state where the gate voltage transitions: the periods P2, P4, P6 and P8

Herein, in order to suppress the amount of voltage fluctuation, it is preferred that the charge operation in the period P1 and the discharge operation in the period P5 are performed reliably. Moreover, as the voltage gradient in the periods P2, P4, P6 and P8 is smaller, the voltage change amounts δVdd and δVss due to an overshoot and an undershoot as described above are smaller, whereby it is possible to suppress the measurement error 8C. Furthermore, it is preferred that the steady periods P3 and P7 in which both transistors are OFF are as short as possible.

Thus, it is possible to suppress the measurement error due to an overshoot or an undershoot if the length of each of the periods P2, P4, P6 and P8 exceeds ⅛ of one cycle.

Second Embodiment

Also in the present embodiment, the CBCM measurement device having a circuit configuration illustrated in FIG. 1 is used.

Figure 5A:
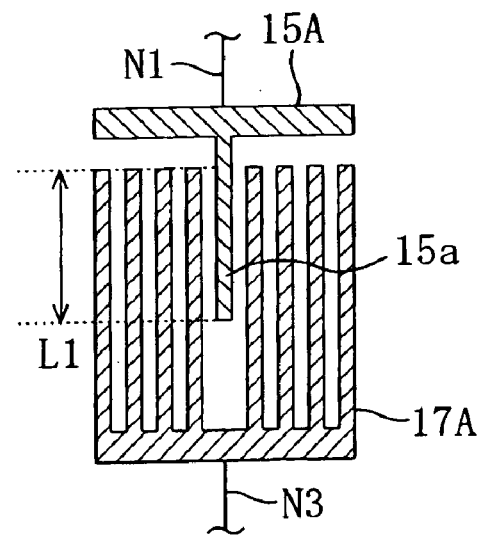
FIG. 5A and FIG. 5B are plan views illustrating the structure of first and second reference conductor sections and that of first and second test conductor sections, respectively, in the second embodiment.
Figure 5B:
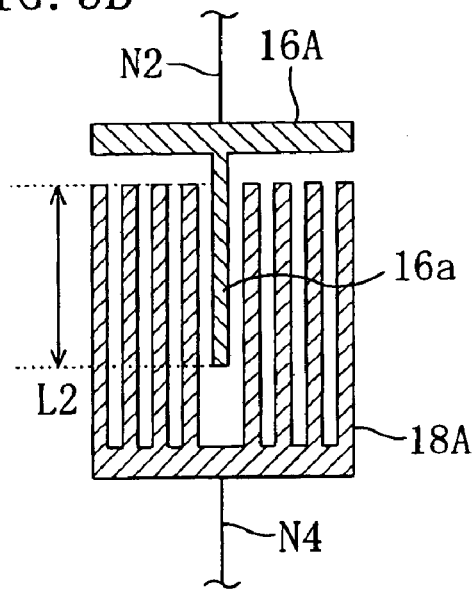

FIG. 5A and FIG. 5B are plan views illustrating the structure of the first and second reference conductor sections and that of the first and second test conductor sections, respectively, in the second embodiment. Herein, a second reference conductor section 17A and a second test conductor section 18A illustrated in FIG. 5A and FIG. 5B are formed by using masks having the same dimension and the same pattern. Moreover, a first reference conductor section 18A and a first test conductor section 16A are formed by using masks having the same dimension and the same pattern except for the lengths L1 and L2 of single lines 15a and 16a in the respective central portions. Assuming that Ltar denotes the basic length corresponding to the target capacitance, the conductor sections 15A, 16A, 17A and 18A are shaped so that Expressions (3) to (5) below are satisfied:

$$L1 = 4 \cdot L\text{tar} \quad (3)$$

$$L2 = 5 \cdot L\text{tar} \quad (4)$$

$$L2 - L1 = L\text{tar} \quad (5)$$

Herein, a line capacitance is proportional to the length of the line. Therefore, since L1=4·Ltar and L2=5·Ltar, the capacitance of a reference capacitor (Cm) and the capacitance of a test capacitor (Cm+Ct) are an integer multiple of the target capacitance Ct. Then, the target capacitance Ct can be obtained based on the difference between the capacitance of the test capacitor (Cm+Ct) and the capacitance of the reference capacitor (Cm).

Thus, by setting the capacitance of the reference capacitor (Cm) and the capacitance of the test capacitor (Cm+Ct) to be an integer multiple of the target capacitance Ct, the capacitance of the reference capacitor and that of the test capacitor are close to each other, whereby the overshoot and undershoot characteristics are brought closer to each other and thus the voltage change amounts δVdd and δVss due to an overshoot and an undershoot are brought closer to each other. Note however that this is based on the assumption that the capacitance of the test capacitor (Cm+Ct) is larger than the capacitance of the reference capacitor (Cm).

Thus, by setting the capacitance of the reference capacitor (dummy capacitance Cm) to be twice or more as much as the target capacitance Ct, and setting the capacitance of the test capacitor (Cm+Ct) to be three times or more as much as the target capacitance Ct, so that the difference therebetween is equal to the target capacitance Ct, the overshoot and undershoot characteristics can be made approximate to each other, and thus the measurement error δC can be suppressed.

Moreover, with such a configuration, the dummy capacitance Cm is increased as in the first embodiment, thereby obtaining the effects of the first embodiment.

Note that it is not always necessary that the capacitance of the reference capacitor (Cm) is set to be an integer multiple (N times) of the target capacitance Ct while the capacitance of the test capacitor (Cm+Ct) is set to be an integer multiple (M times) of the target capacitance Ct. However, with such a configuration, it is possible to precisely measure the capacitance of a minute line pattern of a size close to the smallest design rule.

Moreover, with a line pattern as illustrated in FIG. 5A and FIG. 5B, the fringe capacitance components Cfy1 and Cfy2 occurring due to a three-dimensional shape as illustrated in FIG. 25A and FIG. 25B can be canceled out by the capacitance difference between the test capacitor and the reference capacitor, whereby it is possible to precisely obtain a two-dimensional line capacitance per unit length.

Note that while the present embodiment has been described above with respect to a case where the first conductor sections 15A and 16A are made of the single lines 15a and 16a, the method of the present embodiment can also be used for measuring the contact capacitance where the first conductor section and the second conductor section are contacts, or for measuring the capacitance between "crossed" lines where the first conductor section and the second conductor section are in separate wiring layers but are crossing each other as viewed in a plan view.

Figure 6A:
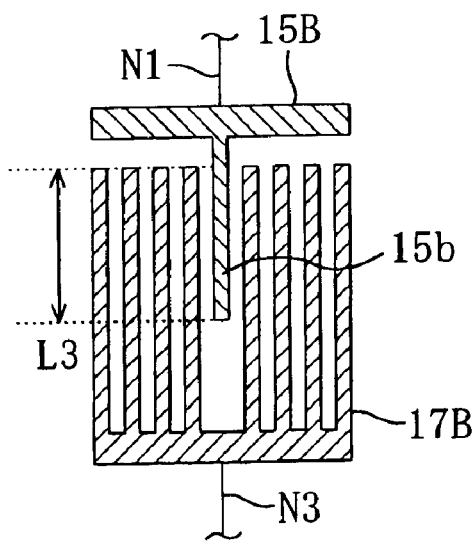
FIG. 6A and FIG. 6B are plan views illustrating the structure of first and second reference conductor sections and that of first and second test conductor sections, respectively, according to a variation of the second embodiment.
Figure 6B:
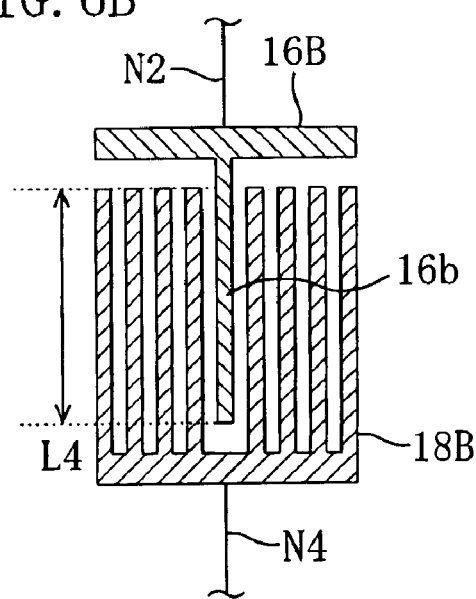

FIG. 6A and FIG. 6B are plan views illustrating the structure of the first and second reference conductor sections and that of the first and second test conductor sections, respectively, according to a variation of the second embodiment. Herein, a second reference conductor section 17B and a second test conductor section 18B illustrated in FIG. 6A and FIG. 6B are formed by using masks having the same dimension and the same pattern. Moreover, a first reference conductor section 15B and a first test conductor section 16B are formed by using masks having the same dimension and the same pattern except for the lengths L3 and L4 of single lines 15b and 16b in the respective central portions. Assuming that Ltar denotes the basic length corresponding to the target capacitance Ct, the conductor sections 15B, 16B, 17B and 18B are shaped so that Expressions (6) to (8) below are satisfied:

$$L3 = 10 \cdot L\text{tar} \quad (6)$$

$$L4 = 20 \cdot L\text{tar} \quad (7)$$

$$L4 - L3 = 10 \cdot L\text{tar} \quad (8)$$

Then, the capacitance difference Ctar between the line 15b and the line 16b is ten times as much as the target capacitance Ct.

Thus, according to the present variation, the target capacitance Ct can be obtained by dividing the capacitance difference Ctar between the capacitance of the test capacitor (Cm+Ctar) and the capacitance of the reference capacitor (Cm) by 10.

As described above, by setting the capacitance of the reference capacitor (Cm) and the capacitance of the test capacitor (Cm+Ctar) to be an integer multiple of the target capacitance Ct, and setting the capacitance difference Ctar to be greater than the target capacitance Ct, the variations in the target capacitance due to the variations in the shape of the actually patterned line are averaged. Therefore, it is possible to reduce the measurement error δC in the target capacitance Ct due to the variations in the process conditions, or the like.

Thus, it is possible to reduce the measurement error δC due to an overshoot or an undershoot by setting the capacitance of the reference capacitor (Cm) to be an integer multiple (N times) of the target capacitance Ct, the capacitance of the test capacitor (Cm+Ctar) to be an integer multiple (M times) of the target capacitance Ct, and the capacitance difference Ctar therebetween to be greater than the target capacitance Ct.

Note that it is not always necessary that the capacitance of the reference capacitor and the capacitance of the test capacitor are an integer multiple of the target capacitance Ct, and it is not always necessary that the capacitance difference between the capacitance of the test capacitor and the capacitance of the reference capacitor is an integer multiple of the target capacitance. However, with a configuration as that in the present variation, it is possible to precisely measure the capacitance of a minute line pattern of a size close to the smallest design rule.

Moreover, with a line pattern as illustrated in FIG. 6A and FIG. 6B, the fringe capacitance components Cfy1 and Cfy2 occurring due to a three-dimensional shape as illustrated in FIG. 25A and FIG. 25B can be canceled out by the capacitance difference between the test capacitor and the reference capacitor, whereby it is possible to precisely obtain a two-dimensional line capacitance per unit length.

Note that while the present variation has been described above with respect to a case where the first conductor sections 15B and 16B are made of the single lines 15b and 16b, the method of the present embodiment can also be used for measuring the contact capacitance where the first conductor section and the second conductor section are contacts, or for measuring the capacitance between "crossed" lines where the first conductor section and the second conductor section are in separate wiring layers but are crossing each other as viewed in a plan view.

Third Embodiment

Figure 7:
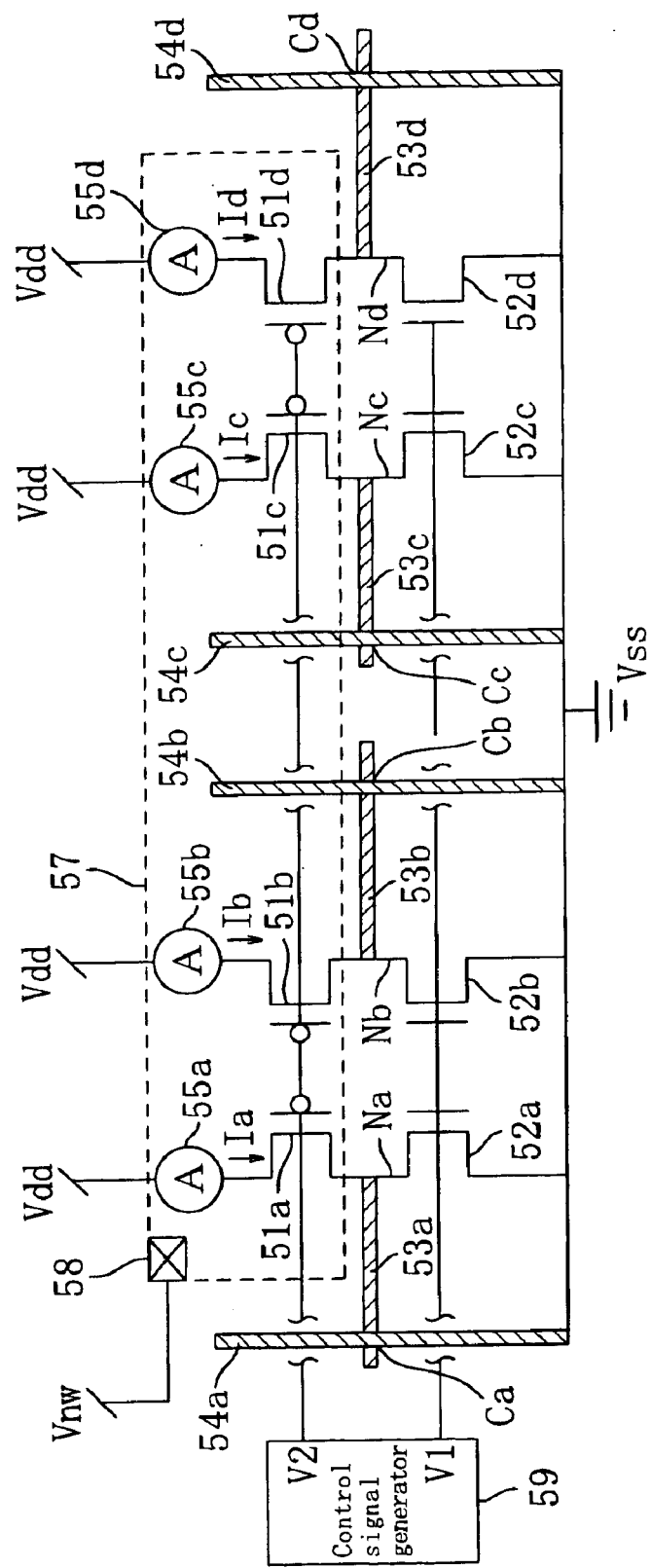
FIG. 7 is a block circuit diagram schematically illustrating a circuit configuration of a CBCM measurement device used in the third embodiment of the present invention.
Figure 8A:
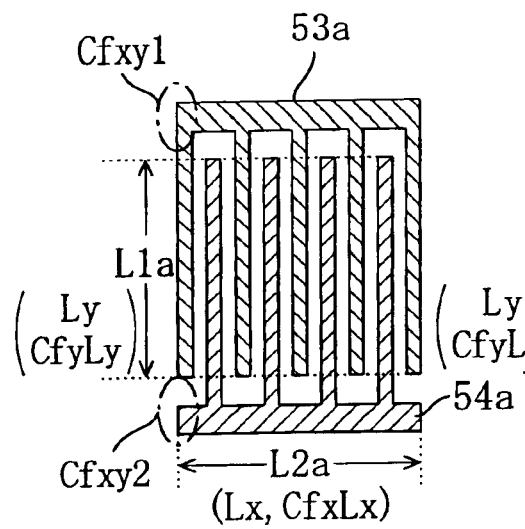
FIG. 8A to FIG. 8D are plan views illustrating different combinations of a first conductor section and a second conductor section according to the third embodiment.
Figure 8B:
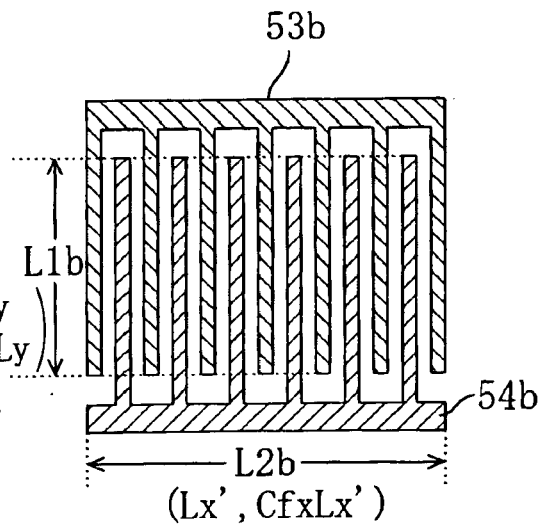
Figure 8C:
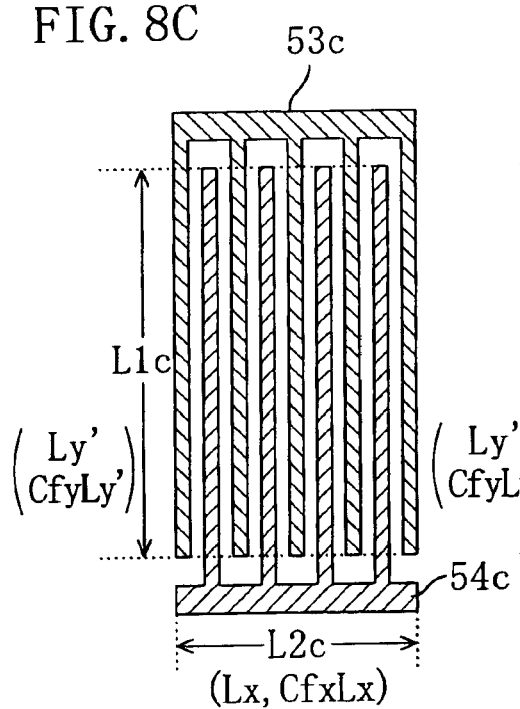
Figure 8D:
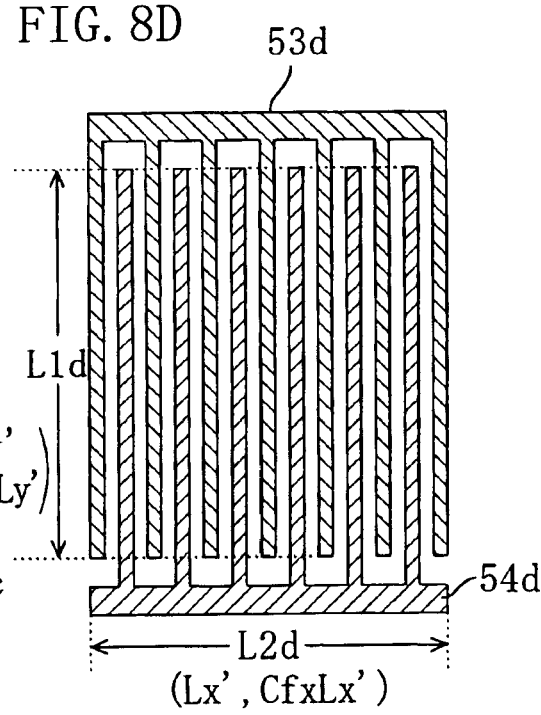

FIG. 7 is a block circuit diagram schematically illustrating a circuit configuration of a CBCM measurement device used in the third embodiment of the present invention.

As illustrated in the figure, the CBCM measurement device of the present embodiment includes four PMIS transistors 51a to 51d, and four NMIS transistors 52a to 52d. The PMIS transistors 51a to 51d have mask dimensions with an equal gate length and an equal gate width, while the NMIS transistors 52a to 52d have mask dimensions with an equal gate length and an equal gate width.

Furthermore, each of the PMIS transistors 51a to 51d and each of the NMIS transistors 52a to 52d are arranged in series with one another between a terminal (pad) for supplying the power supply voltage Vdd and another terminal (pad) for supplying the ground voltage Vss. Thus, the power supply voltage Vdd is supplied to the source of each of the PMIS transistors 51a to 51d, and the ground voltage Vss is supplied to the source of each of the NMIS transistors 52a to 52d. The drains of the PMIS transistors 51a to 51d and the drains of the NMIS transistors 52a to 52d are connected to each other via common nodes Na to Nd, respectively.

Moreover, a pad 58 for supplying the body voltage Vnw is provided in an active region 57 of the PMIS transistors 51a to 51d.

Furthermore, the CBCM device includes first conductor sections 53a to 53d (first lines) connected to the nodes Na to Nd, respectively, and second conductor sections 54a to 54d (second lines). The first conductor sections 53a to 53d and the second conductor sections 54a to 54d together form capacitors having capacitance values Ca to Cd, respectively, with an insulating layer interposed therebetween. The second conductor sections 54a to 54d are grounded.

Furthermore, the CBCM device includes a control signal generator 59, which is means for generating a control signal for turning the transistors ON/OFF. By using the control signal generator 59, the control voltage V1 is supplied to the gates of the NMIS transistors 52a to 52d, and the control voltage V2 to the gates of the PMIS transistors 51a to 51d.

Moreover, the CBCM device includes reference current measurement pads 55a to 55d for measuring reference currents Ia to Id flowing through the PMIS transistors 51a to 51d, respectively.

FIG. 5A to FIG. 5D are plan views illustrating different combinations of a first conductor section and a second conductor section that together form a capacitor according to the third embodiment. The first conductor sections and the second conductor sections each include a plurality of comb teeth and a base portion that supports the comb teeth. In FIG. 8A to FIG. 8D, L1a to L1d denote the lengths by which the comb teeth of the first conductor sections 53a to 53d are meshed with those of the second conductor sections 54a to 54d, respectively, L2a to L2d denote the lengths of the base portions of the second conductor sections 54a to 54d, respectively, and N2a to N2d denote the numbers of comb teeth of the second conductor sections 54a to 54d, respectively. These parameters are set so that L1a=L1b=Ly, L1c=L1d=1y', L2a=L2c=Lx, L2b=L2d=Lx', N2a=N2c=Nx and N2b=N2d=Nx' (where Nx<Nx' and Ly<Ly').

In other words, the numbers N of comb teeth and the lengths L by which the comb teeth are meshed with each other of the four sets of comb-shaped patterns, each forming a capacitor, are as follows: (Nx, Ly), (Nx, Ly'), (Nx', Ly) and (Nx', Ly').

Assuming that the line capacitance per unit length to be obtained is C, and the capacitance of the capacitor connected to the drain terminal of each transistor is Ctr, the capacitance values Ca to Cd of the capacitors are as follows:

$$Ca = Ctr + CNxLy + 2CfxLx + 2CfyLy + 2Cfxy1 + 2Cfxy2$$

$$Cb = Ctr + CNx'Ly + 2CfxLx' + 2CfyLy + 2Cfxy1 + 2Cfxy2$$

$$Cc = Ctr + CnxLy' + 2CfxLx + 2CfyLy' + 2Cfy1 + 2Cfxy2$$

$$Cd = Ctr + Cnx'Ly' + 2CfxLx' + 2CfyLy' + 2Cfxy1 + 2Cfxy2$$

In these expressions for the capacitance values Ca to Cd, the transistor capacitance Ctr and the three-dimensional fringe components Cfx, Cfy, Cfxy1 and Cfxy2 can be canceled out to yield:

$$Cd-(Cb+Cc)-Ca=C(Nx'-Nx)\cdot(Ly'-Ly)$$

Thus, the capacitances Ca to Cd of the capacitors can be obtained by measuring the currents Ia to Id by using the current measurement pads 55a to 55d. Therefore, it is possible to precisely obtain the line capacitance C per unit length.

With the CBCM device of the present embodiment, it is possible to obtain the two-dimensional line capacitance per unit length from four comb-shaped periodic L/S patterns. Thus, as compared with the conventional CBCM device, the three-dimensional fringe components can easily be canceled out, whereby it is possible to precisely obtain the two-dimensional line capacitance per unit length.

Figure 9:
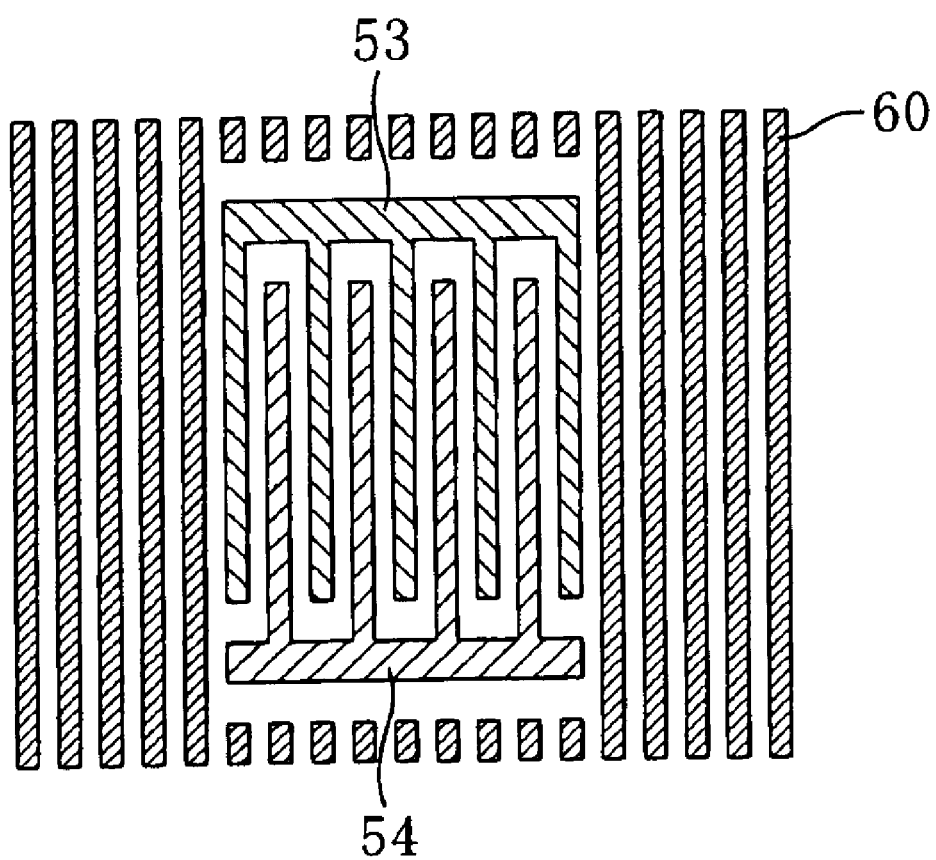
FIG. 9 is a plan view illustrating only a line pattern according to a variation of the third embodiment.

FIG. 9 is a plan view illustrating only a line pattern according to a variation of the third embodiment. As illustrated in the figure, a dummy line pattern 60 is provided around a first conductor section 53 (the first conductor sections 53a to 53d of the third embodiment) and a second conductor section 54 (the second conductor sections 54a to 54d of the third embodiment).

By forming the dummy line pattern 60 around the test line patterns 53 and 54, the capacitance densities of the four capacitors illustrated in FIG. 7 (the capacitors having the capacitance values Ca to Cd) at various portions of the line pattern can be made uniform, and thus the final L/S dimensions can be made substantially uniform.

Fourth Embodiment

Figure 10A:
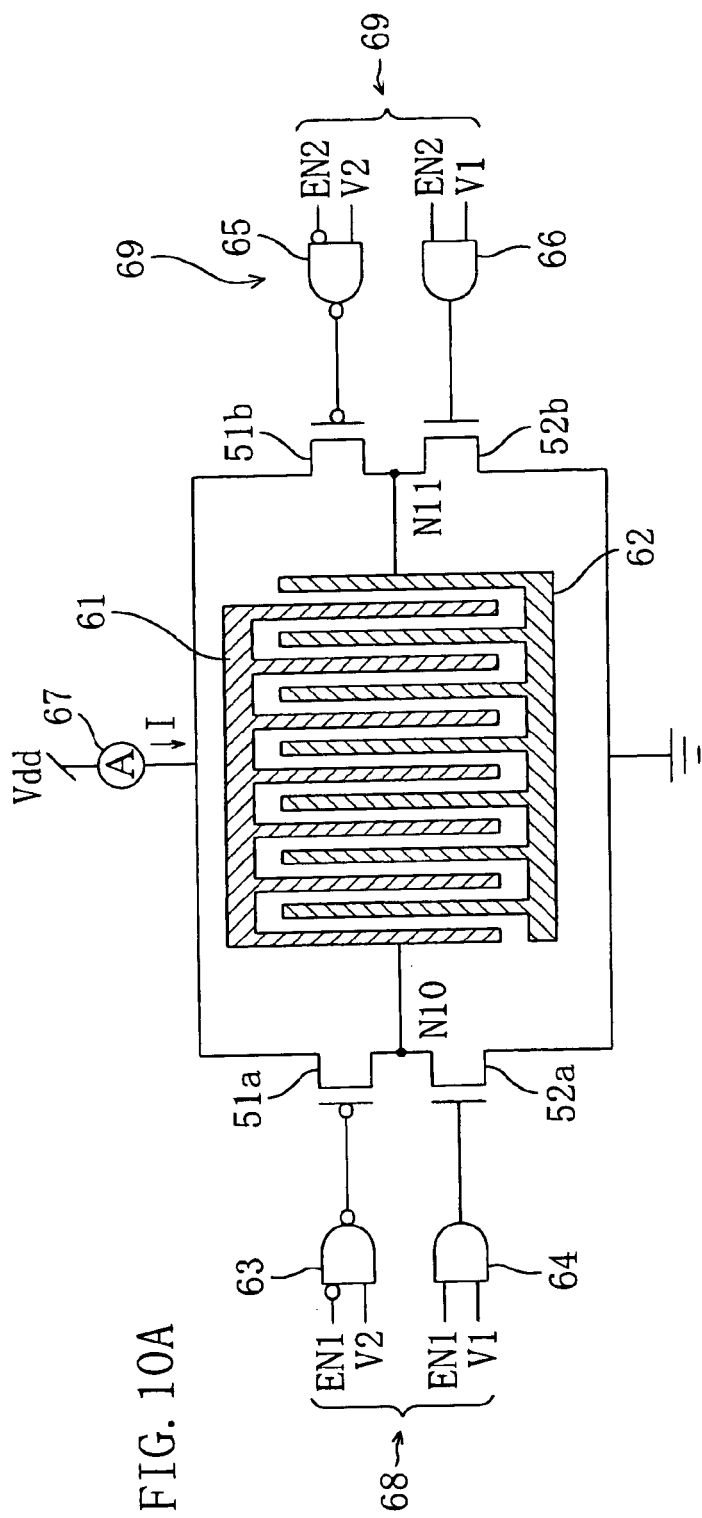
FIG. 10A is a block circuit diagram schematically illustrating a circuit configuration of a CBCM measurement device used in the fourth embodiment of the present invention.
Figure 10C:
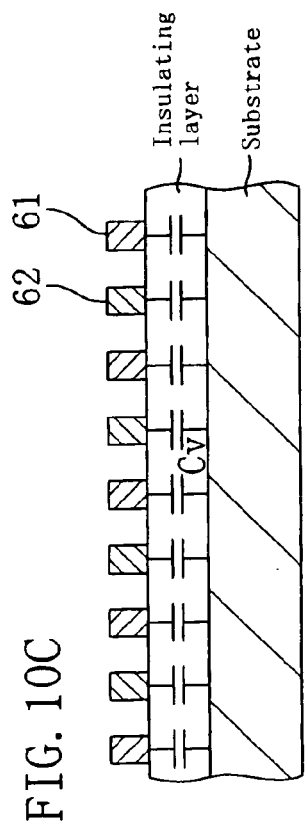
FIG. 10B and FIG. 10C are cross-sectional views thereof illustrating capacitor components occurring in a first control state and those occurring in a second control state, respectively.
Figure 10B:
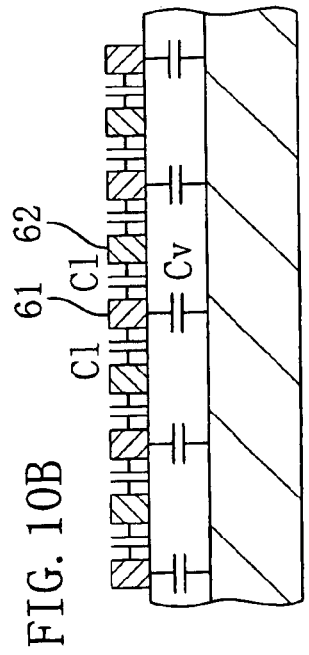

FIG. 10A is a block circuit diagram schematically illustrating a circuit configuration of a CBCM measurement device used in the fourth embodiment of the present invention. FIG. 10B and FIG. 10C are cross-sectional views thereof illustrating capacitor components occurring in a first control state and those occurring in a second control state, respectively.

As illustrated in the figures, the CBCM measurement device of the present embodiment includes a first PMIS transistor 51a, a second PMIS transistor 51b, a first NMIS transistor 52a, and a second NMIS transistor 52b. The PMIS transistors 51a and 51b have mask dimensions with an equal gate length and an equal gate width, while the NMIS transistors 52a and 52b have mask dimensions with an equal gate length and an equal gate width.

The first PMIS transistor 51a and the first NMIS transistor 52a are arranged in series with each other between a terminal (pad) for supplying the power supply voltage Vdd and another terminal (pad) for supplying the ground voltage Vss. Thus, the power supply voltage Vdd is supplied to the source of each of the first and second PMIS transistors 51a and 51b, and the ground voltage Vss is supplied to the source of each of the first and second NMIS transistors 52a and 52b.

The drains of the PMIS transistors 51a and 51b and the drains of the NMIS transistors 52a and 52b are connected to each other via common nodes N10 and N11, respectively. Note that although not shown, a pad for supplying the body voltage Vnw is provided in an active region of the PMIS transistors 51a and 51b. Furthermore, the CBCM device includes a first conductor section 61 connected to the node N10, and a second conductor section 62 connected to the node N11. The first conductor section 61 and the second conductor section 62 together form a capacitor with an insulating layer interposed therebetween. Note however that a capacitor is also formed between the first and second conductor sections 61 and 62 and the substrate to which they are grounded.

Furthermore, the CBCM device includes first and second control signal generations circuits 68 and 69, each of which is means for generating a control signal for turning the transistors ON/OFF. Specifically, the first control signal generation circuit 68 includes a NAND circuit 63 receiving the control voltage V2 and a inverted signal of an enable signal EN1, and an AND circuit 64 receiving the enable signal EN1 and the control voltage V1. The second control signal generation circuit 69 includes a NAND circuit 65 receiving the control voltage V2 and an inverted signal of an enable signal EN2, and an AND circuit 66 receiving the enable signal EN2 and the control voltage V1. Moreover, a terminal (current measurement pad 67) for supplying the power supply voltage Vdd is used to measure the current flowing through the circuit.

In the first control state, only the enable signal EN1 is ON (H), and the control voltages V1 and V2 are output from the first control signal generation circuit 68, whereby the first PMIS transistor 51a and the first NMIS transistor 52a operate according to the control voltages V1 and V2. Thus, as described above in the first embodiment, the capacitance of the first conductor section 61 is measured based on the current I, which is measured at the NAND circuit 65. In this operation, the enable signal EN2 is not turned ON, and thus the second NMIS transistor 52b is always ON, whereby the node N11 is fixed at the ground voltage Vss. Therefore, the capacitance measured in this operation is 2Cl+Cv, as illustrated in FIG. 10B. Note that Cl denotes the capacitance between each pair of lines, and Cv denotes the capacitance between a line and the substrate.

In the second control state, the two enable signals EN1 and EN2 are turned ON at the same time, and the transistors 51a to 52b operate according to the control voltages V1 and V2. In this operation, since the two enable signals EN1 and EN2 are turned ON at the same time, the comb-shaped lines (first and second conductor sections 61 and 62) are at the same potential. Therefore, the capacitance measured in this operation is 2Cv, as illustrated in FIG. 10C. Since two CBCM circuits are operating at the same time, the capacitance is calculated while counting, as two transistors, each reference transistor for canceling out the dummy capacitance or the transistor parasitic capacitance.

With the CBCM device of the present embodiment, the control voltages V1 and V2 are controlled independently by using the enable signals EN1 and EN2, whereby it is possible to perform the CBCM evaluation simultaneously for one or more target (in the present embodiment, the first and second conductor sections 61 and 62 are both targets) while the current measurement pad 67 (power supply pad) is fixed.

Thus, the value of Cl times 2 plus Cv, and the value of Cv times 2, can be measured by using the first and second conductor sections 61 and 62 having the same pattern, whereby Cl and Cv can be measured separately.

In other words, with the CBCM device of the present embodiment, it is possible to separately measure a capacitance between conductors that are opposing each other substantially in the same plane and a capacitance between conductors that are opposing each other in the vertical direction. A specific configuration of the present embodiment has made it easy to separate line capacitance components Cl and Cv, which have been difficult to separate in the prior art, in the same pattern (Cl denotes the capacitance between lines in the same wiring layer, and Cv denotes the capacitance between a line in a wiring layer and a conductive layer in another layer (the substrate in the present embodiment)).

Fifth Embodiment

Figure 11:
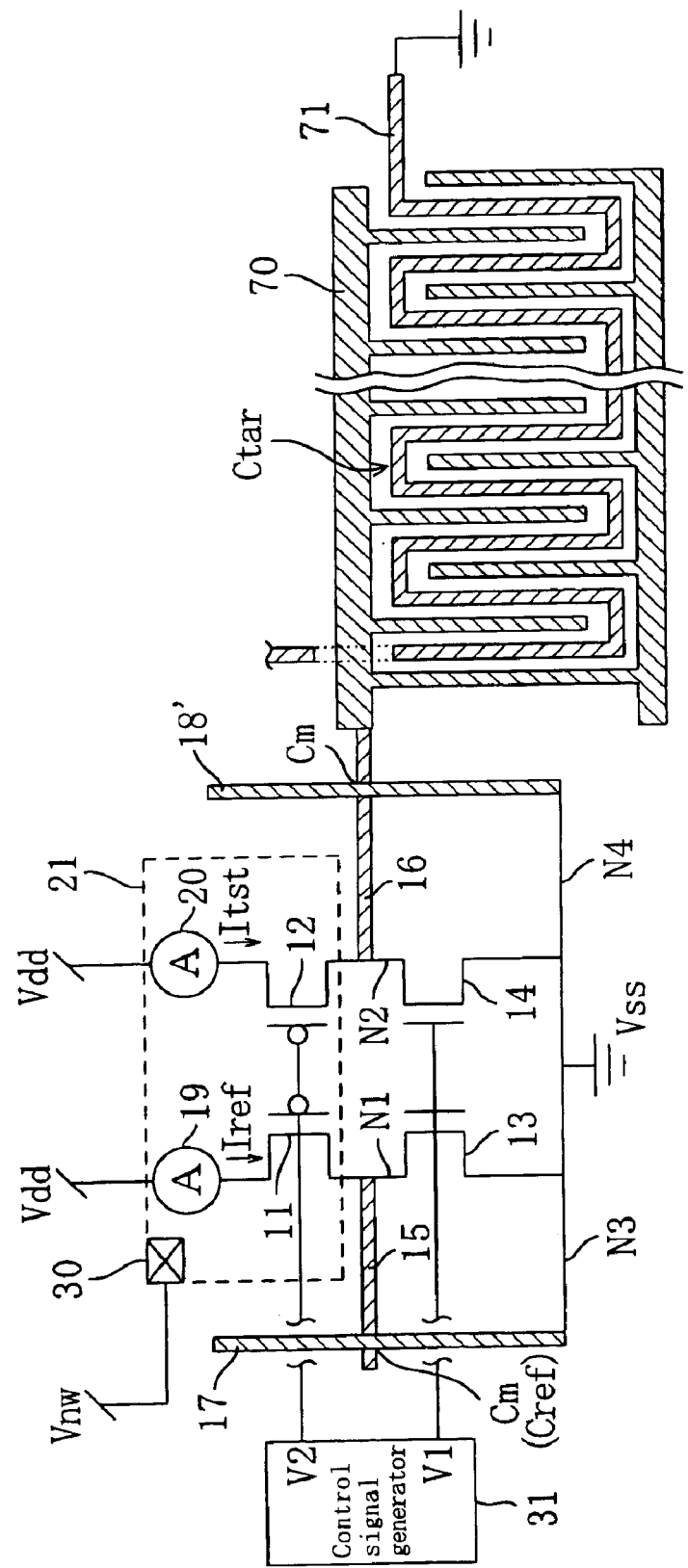
FIG. 11 is a block circuit diagram schematically illustrating a circuit configuration of a CBCM measurement device used in the fifth embodiment of the present invention.

FIG. 11 is a block circuit diagram schematically illustrating a circuit configuration of a CBCM measurement device used in the fifth embodiment of the present invention.

As illustrated in the figure, the CBCM measurement device of the present embodiment includes many of the members of the CBCM device of the first embodiment illustrated in FIG. 1. Specifically, the CBCM device of the present embodiment includes the reference PMIS transistor 11, the test PMIS transistor 12, the reference NMIS transistor 13 and the test NMIS transistor 14, and the reference PMIS transistor 11 and the reference NMIS transistor 13 are connected to each other via the common first node N1, while the test PMIS transistor 12 and the test NMIS transistor 14 are connected to each other via the common second node N2.

Furthermore, the CBCM device includes the first reference conductor section 15, the first test conductor section 16, the second reference conductor section 17 and a second test conductor section 18'. The second reference conductor section 17 and the second test conductor section 18' are grounded via the nodes N3 and N4, respectively.

Furthermore, the CBCM device includes the control signal generator 31, which is means for generating a control signal for turning the transistors ON/OFF. By using the control signal generator 31, the control voltage V1 is supplied to the gates of the reference NMIS transistor 13 and the test NMIS transistor 14, and the control voltage V2 to the gates of the reference PMIS transistor 11 and the test PMIS transistor 12.

Moreover, the CBCM device includes the reference current measurement pad 19 for measuring the reference current Iref flowing through the reference PMIS transistor 11, and the test current measurement pad 20 for measuring the test current Itst flowing through the test PMIS transistor 12.

A feature of the present embodiment is the provision of a comb-shaped line 70 connected to the first test conductor section 16, and a snake-shaped line 71 that is grounded and forms a capacitor together with the comb-shaped line 70.

Alternatively, the snake-shaped line 71 may be connected to the first test conductor section 16 while the comb-shaped line 70 is grounded. Moreover, the comb-shaped line 70 of the present embodiment includes an upper base portion and a lower base portion, with comb-tooth-shaped lines extending from the upper and lower base portions. Thus, the comb-shaped line 70 includes two comb-shaped patterns. However, it may alternatively have only one comb-shaped pattern.

In the present embodiment, a capacitor having the reference capacitance Cref, which is equal to the dummy capacitance Cm, is formed between the first and second reference conductor sections 15 and 17, and a capacitor having the dummy capacitance Cm is formed between the first and second test conductor sections 16 and 18'. A capacitor whose capacitance value is an integer multiple of the target capacitance Ct is present between the comb-shaped line 70 and the snake-shaped line 71. Note however that the capacitor having the dummy capacitance Cm does not always have to be present between the first and second test conductor sections 16 and 18'. Moreover, it is not necessary that the capacitance between the comb-shaped line 70 and the snake-shaped line 71 is an integer multiple of the target capacitance.

In the present embodiment, the target capacitance Ctar can be measured in the same manner as in the second embodiment. In the present embodiment, the line resistance can be measured by using the snake-shaped line 71, whereby it is possible to relatively accurately estimate the cross-sectional area of a snake-shaped line in a direction perpendicular to the longitudinal direction thereof. Then, the cause of the variations in the line capacitance can be presumed based on the estimated dimension so that measures such as correcting a measured value can be employed.

Figure 12:
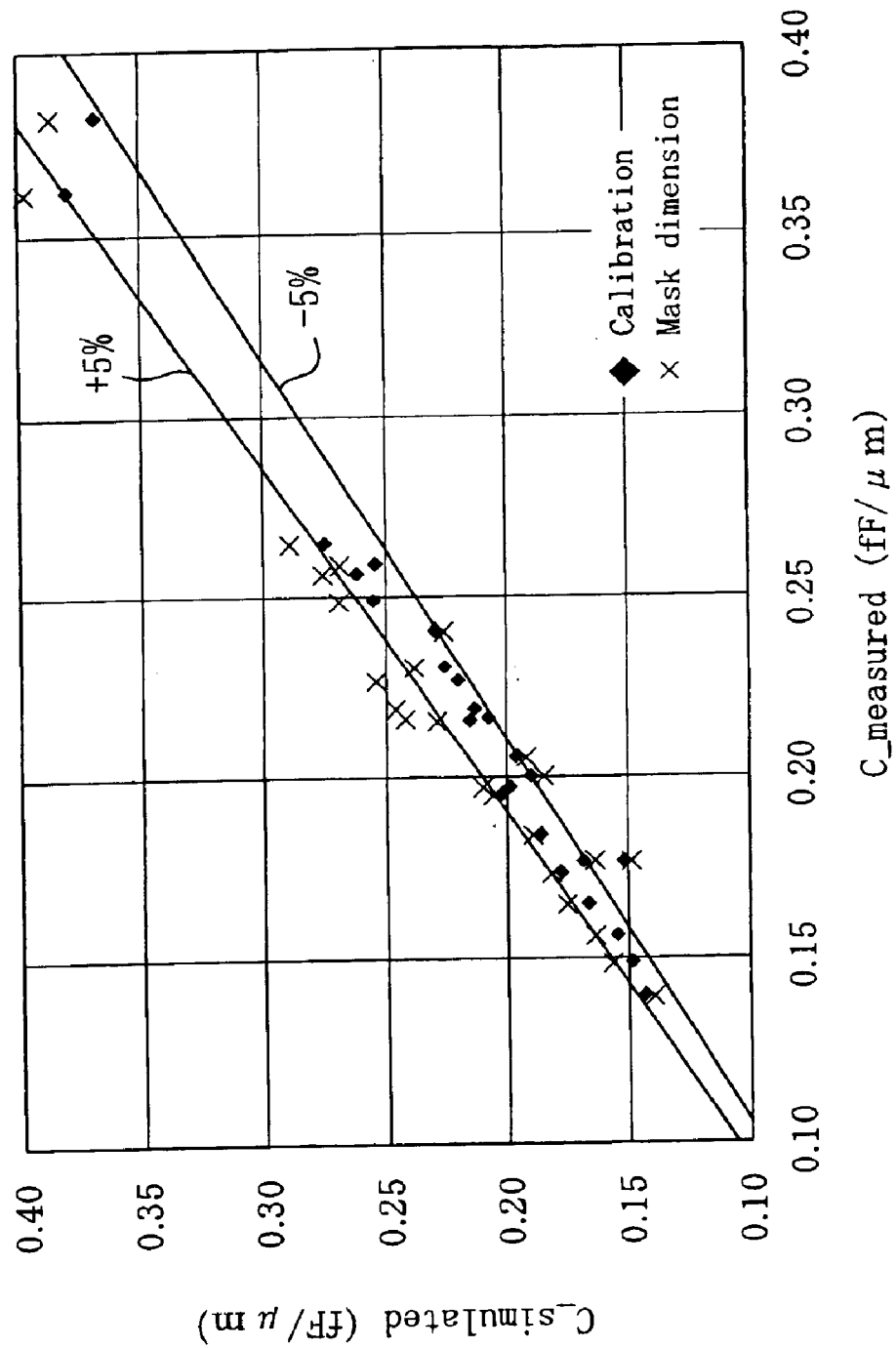
FIG. 12 is a graph illustrating an error between a simulated capacitance value and a measured capacitance value for each of a case where the target capacitance is calculated based only on the mask dimensions and another case where the target capacitance is calculated with a calibration based on the evaluation of the electrical shape.

FIG. 12 is a graph illustrating the error between the simulated capacitance value and the measured capacitance value for each of a case where the target capacitance is calculated based only on the mask dimensions ("X" in the graph) and another case where the target capacitance is calculated with a calibration based on the evaluation of the electrical shape ("♦" in the graph). As can be seen in the graph, the error is suppressed and the measurement precision is improved with a calibration.

Figure 13A:
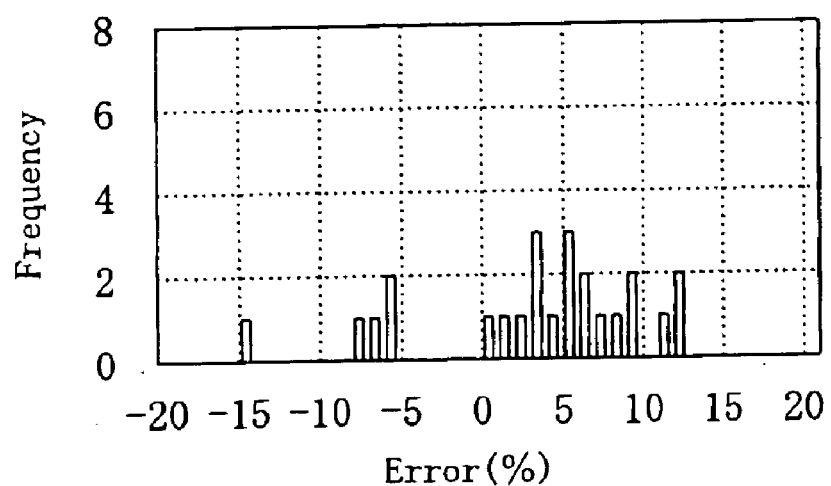
FIG. 13A and FIG. 13B are histograms illustrating the measurement error in the case where the capacitance is measured based only on the mask dimensions and that in the case where the capacitance is measured with a calibration, respectively.
Figure 13B:
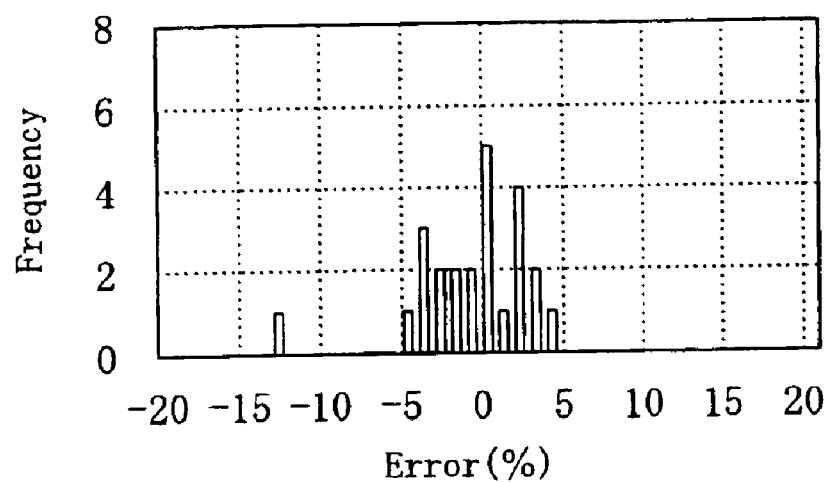

FIG. 13A and FIG. 13B are histograms illustrating the measurement error in the case where the capacitance is measured based only on the mask dimensions and that in the case where the capacitance is measured with a calibration, respectively. In the case where the capacitance is measured based only on the mask dimensions, there are many data points that are outside the ±5% range, as illustrated in FIG. 13A, whereas the measurement error can be suppressed substantially within the ±5% range, as illustrated in FIG. 13B, by using a calibration based on the evaluation of the electrical shape.

Thus, when the snake-shaped line 71 is used in the measurement of the target capacitance, as in the present embodiment, it is possible to perform a calibration based on the evaluation of the electrical shape, which is difficult to perform with a comb-shaped line, whereby it is possible to improve the measurement precision.

Particularly, a line capacitance can be measured precisely with a relatively high stability as compared with the measurement of a dielectric constant, whereby significant effects can be provided by using the line capacitance as a parameter of an electrical calibration.

Sixth Embodiment

Figure 14:
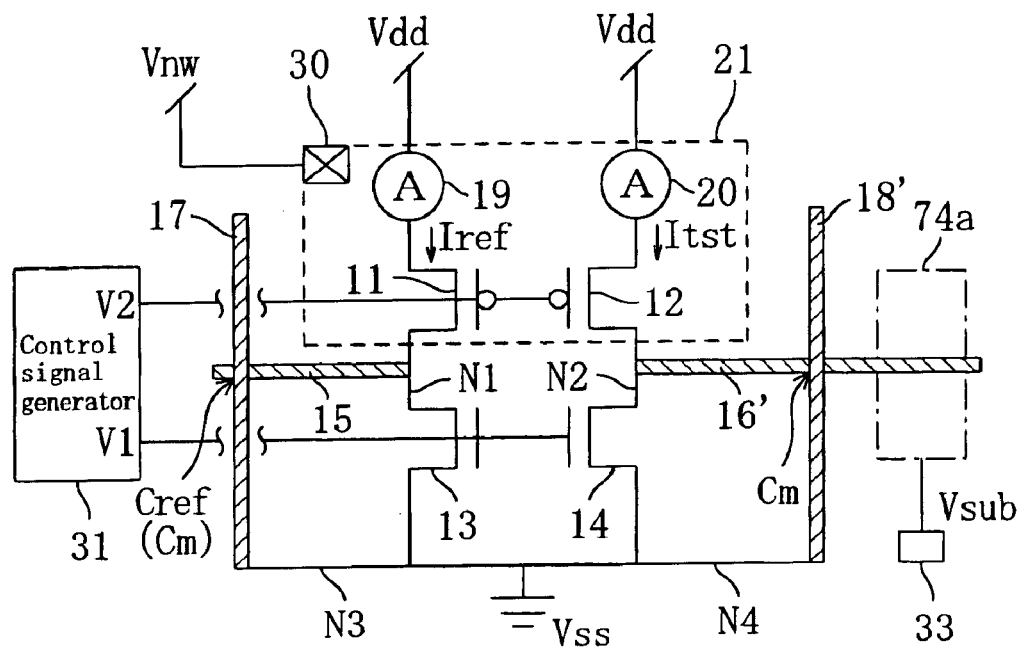
FIG. 14 is a block circuit diagram schematically illustrating a circuit configuration of a CBCM measurement device used in the sixth embodiment of the present invention.

FIG. 14 is a block circuit diagram schematically illustrating a circuit configuration of a CBCM measurement device used in the sixth embodiment of the present invention.

As illustrated in the figure, the CBCM measurement device of the present invention includes many of the members of the CBCM device of the first embodiment illustrated in FIG. 1. Specifically, the CBCM device of the present embodiment includes the reference PMIS transistor 11, the test PMIS transistor 12, the reference NMIS transistor 13 and the test NMIS transistor 14, and the reference PMIS transistor 11 and the reference NMIS transistor 13 are connected to each other via the common first node N1, while the test PMIS transistor 12 and the test NMIS transistor 14 are connected to each other via the common second node N2.

Furthermore, the CBCM device includes the first reference conductor section 15, a first test conductor section 16', the second reference conductor section 17 and the second test conductor section 18'. The second reference conductor section 17 and the second test conductor section 18' are grounded via the nodes N3 and N4, respectively.

Furthermore, the CBCM device includes the control signal generator 31, which is means for generating a control signal for turning the transistors ON/OFF. By using the control signal generator 31, the control voltage V1 is supplied to the gates of the reference NMIS transistor 13 and the test NMIS transistor 14, and the control voltage V2 to the gates of the reference PMIS transistor 11 and the test PMIS transistor 12.

Moreover, the CBCM device includes the reference current measurement pad 19 for measuring the reference current Iref flowing through the reference PMIS transistor 11, and the test current measurement pad 20 for measuring the test current Itst flowing through the test PMIS transistor 12.

A feature of the present embodiment is that the first test conductor section 16' extends over a triple-well region 74a of the substrate, and a capacitor having a target capacitance Ct' is formed between the first test conductor section 16' and the substrate. A pad 33 is provided for supplying a voltage Vsub to control the voltage of the triple-well region 74a. Thus, it is possible to independently control the voltage of the triple-well region 74a. In the present embodiment, a capacitor having the reference capacitance Cref, which is equal to the dummy capacitance Cm, is formed between the first and second reference conductor sections 15 and 17, and a capacitor having the dummy capacitance Cm is formed between the first and second test conductor sections 16' and 18'.

Figure 15:
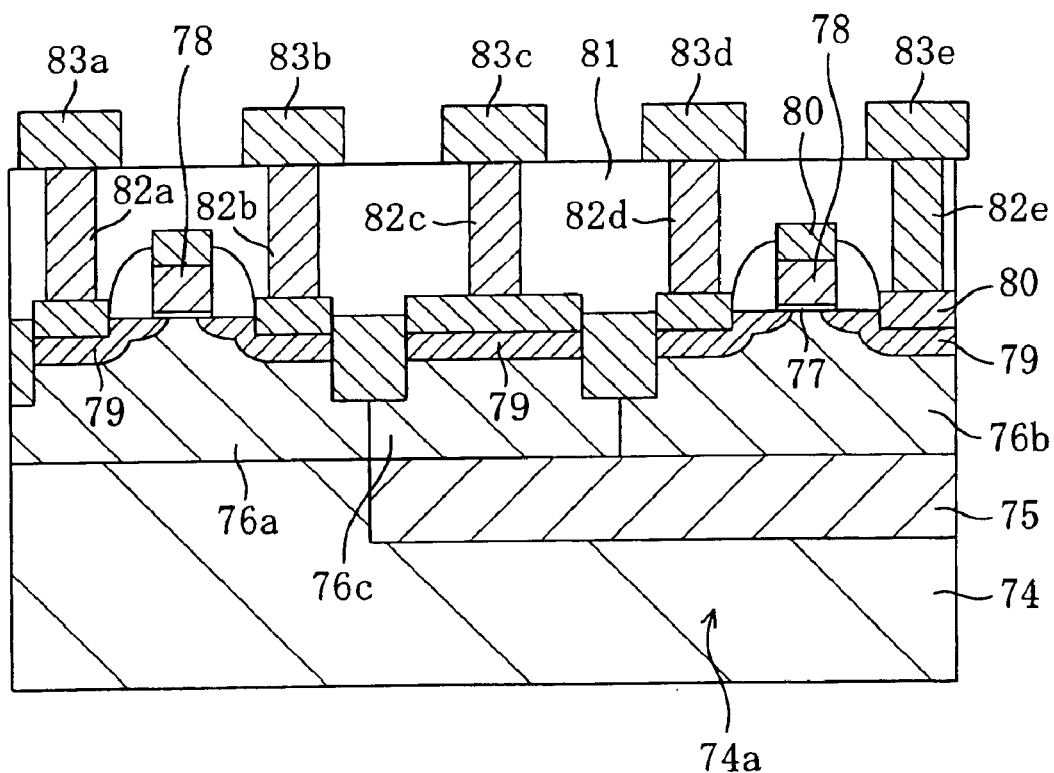
FIG. 15 is a cross-sectional view illustrating an example of a semiconductor device having a triple-well structure.

FIG. 15 is a cross-sectional view illustrating an example of a semiconductor device having a triple-well structure. A deep N-well 75, two different P-wells 76a and 76b, and an N-well 76c are formed in a substrate 74. The P-well 76a is formed in a region that is not adjacent to the deep N-well 75, and the P-well 76b and the N-well 76c are formed over the deep N-well 75. Thus, the triple-well region 74a is a region of the substrate 74 including the deep N-well 75, the P-well 76b and the N-well 76c.

A transistor is provided in each active region that is surrounded by a device isolation structure. The transistor includes a gate insulating film 77, a gate electrode 78, an N-type impurity diffusion region 79, and a silicide layer 80 provided above a gate electrode 78 and the source/drain region 79. Note that an N-channel MIS transistor is provided on the P-well 76a or 76b, and a P-channel MIS transistor is provided on the N-well 76c. Moreover, the semiconductor device includes an interlayer insulating film 81 covering the transistors, plugs 82a to 82e each running through the interlayer insulating film 81 to reach the source/drain region 79, and lines 83a to 83e provided on the interlayer insulating film 81 and connected to the plugs 82a to 82e, respectively.

Herein, the transistor on the P-well 76a illustrated in FIG. 15 corresponds to the test NMIS transistor 14 illustrated in FIG. 14. Moreover, the line 83b illustrated in FIG. 15 is connected to the lines 83c to 83d (the connection is not shown), and the lines 83b to 83d and the plugs 82b to 82d correspond to the test conductor section 16' illustrated in FIG. 14.

Thus, the CBCM device of the present embodiment includes a substrate terminal (pad 33) for controlling the voltage Vsub of the triple-well region 74a independently of the ground voltage Vss, separately from the ground terminal that is provided in a conventional CBCM semiconductor device. Therefore, with the CBCM device of the present embodiment, it is possible to measure the voltage dependence of the capacitance of an MIS capacitor, or the like, by changing the potential difference between the voltage of the lines 83c to 83d and the voltage Vsub of the triple-well region 74a.

Figure 16:
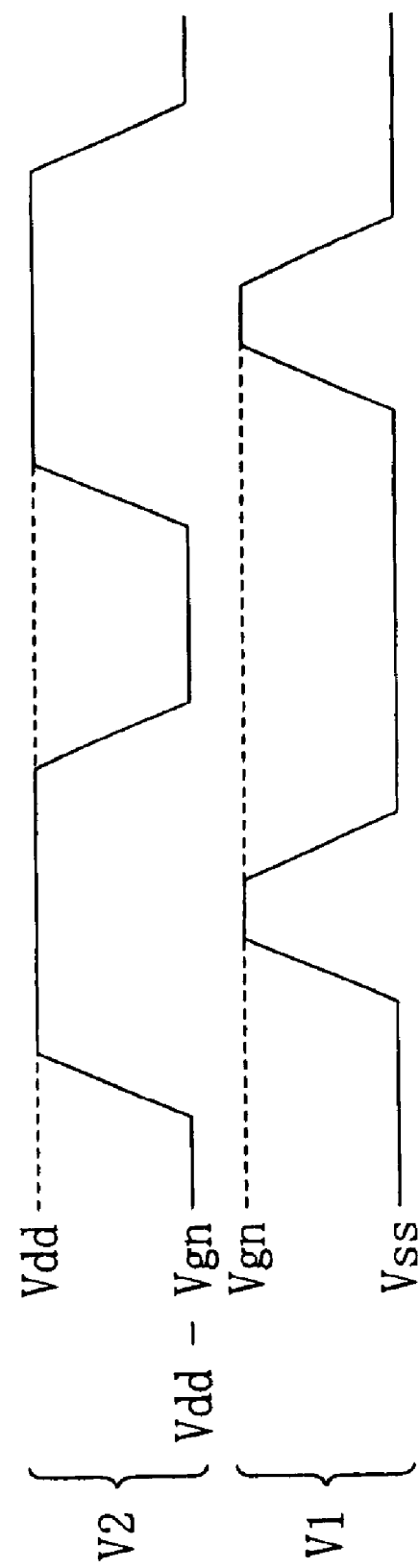
FIG. 16 is a timing chart illustrating input waveforms of control voltages generated by a control signal generator.

FIG. 16 is a timing chart illustrating the input waveforms of the control voltages V1 and V2 generated by the control signal generator 31. As illustrated in FIG. 16, the maximum voltage of the input voltage (control voltage V2) to the gates of the PMIS transistors 11 and 12 is equal to the power supply voltage Vdd supplied from the power supply voltage supply terminal and is smaller than the maximum voltage (Vgn) of the input voltage (control voltage V1) to the gates of the NMIS transistors 13 and 14. Moreover, the minimum voltage (Vdd−Vgn) of the input voltage (control voltage V2) to the gates of the PMIS transistors 11 and 12 is set to a negative value. For example, a large gate overdrive is obtained by setting Vdd to be 0.1 V and Vgn to be 2 V.

It is possible to easily measure the C-V characteristics (the voltage dependence of a capacitance) by measuring changes in the current flowing through the circuit by utilizing this structure. Specifically, while the expression:

$$I2-I1=(\int C(V)dV(V=0 \text{ to } Vdd))\cdot f$$

holds in a case where the capacitance has a voltage dependence, as does a gate capacitance or a junction capacitance, this can be approximated to Expression (9) below:

$$I2-I1=C(V)\cdot Vdd\cdot f \qquad (9)$$

by setting Vdd to a very small value (0.1 V in the present embodiment).

Figure 17:
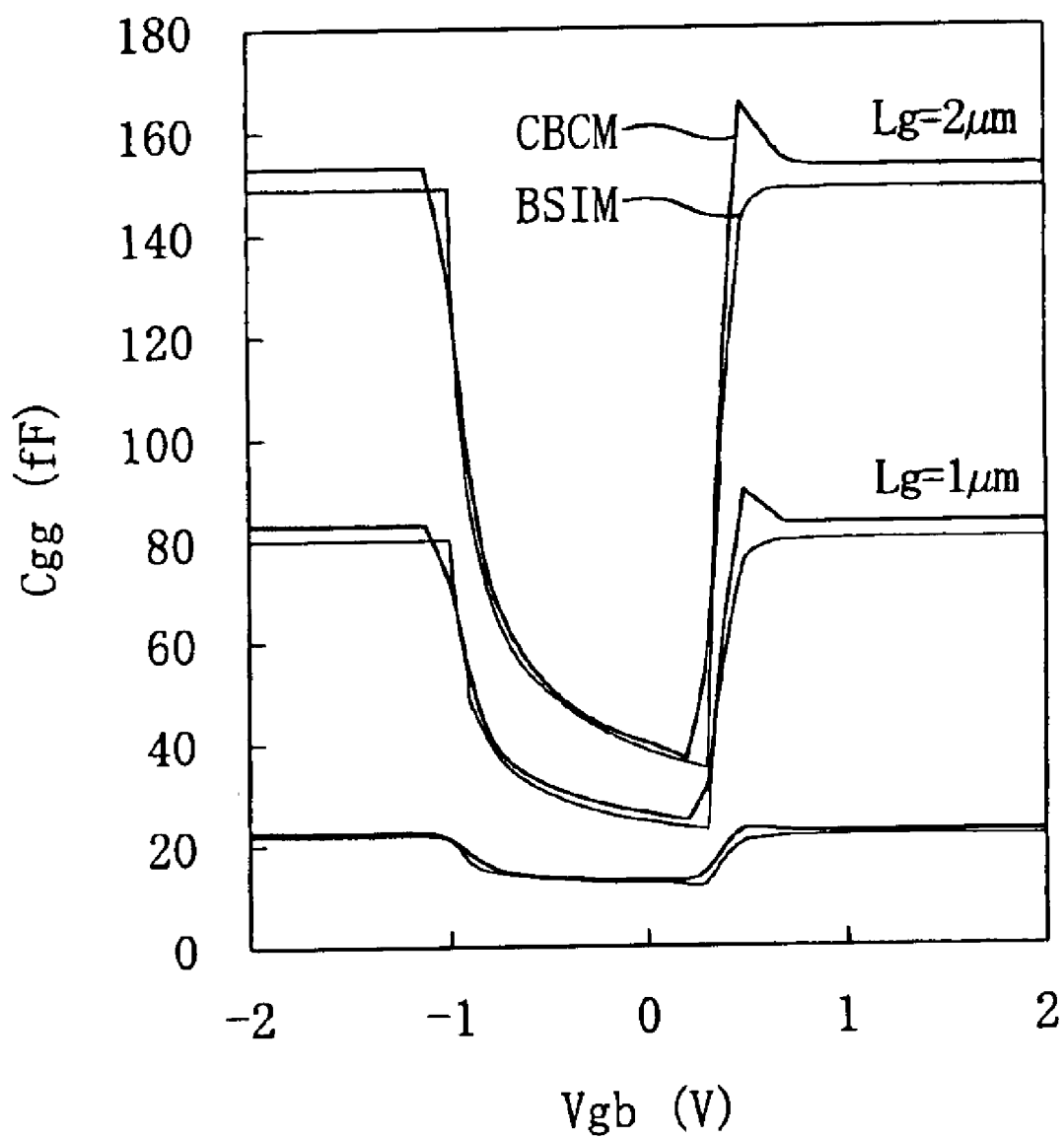
FIG. 17 shows the voltage dependence of the gate-substrate capacitance obtained by an HSPICE simulation according to the CBCM method of the sixth embodiment, and that obtained by a BSIM model.

FIG. 17 shows the voltage dependence of the gate-substrate capacitance Cgg obtained by an HSPICE simulation according to the CBCM method of the present embodiment, and that obtained by a BSIM model. In the figure, the horizontal axis represents the voltage Vgb between the node N2 and the substrate 74 illustrated in FIG. 14. The characteristic curve labeled "BSIM" represents data that is obtained by using a standard model included in the HSPICE simulation. The characteristic curve labeled "CBCM" in FIG. 17 represents data that is obtained by inputting the control voltages V1 and V2 to the gates of the transistors in the CBCM device illustrated in FIG. 14, measuring the currents Iref and Itst flowing through the nodes N1 and N2 by the current measurement pads 19 and 20, respectively, integrating the currents Iref and Itst, and conducting a calculation based on Expression (9).

As can be seen from FIG. 17, the circuit simulation results obtained by using the CBCM method quite well resemble those obtained by using the BSIM model. Since a BSIM model cannot be used unless the dimensions of transistors, lines, etc., are known, it is difficult to obtain the voltage dependence of a capacitance by using a BSIM model in an actual process. Thus, it can be seen that a capacitance measurement method that uses a CBCM semiconductor device and a CBCM method of the present embodiment is effective.

Therefore, according to the present embodiment, it is possible to easily and relatively precisely measure the voltage dependence of a capacitance by using a CBCM device in an actual process.

Particularly, significant effects can be obtained by setting the voltage of a current measurement terminal to be very small as in the present embodiment.

Seventh Embodiment

Figure 18A:
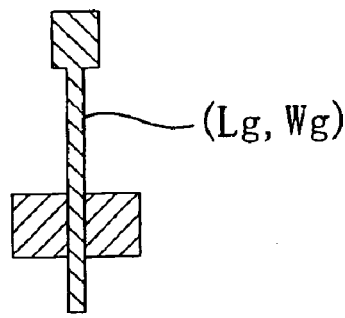
FIG. 18A to FIG. 18E are plan views illustrating a target gate structure, and gate electrodes for estimating a dimension of the target gate structure.

In the present embodiment, the semiconductor device of the first embodiment illustrated in FIG. 1 is used. FIG. 18A to FIG. 18E are plan views illustrating a target gate structure having the target capacitance Ct in FIG. 1, and gate electrodes for estimating a dimension of the target gate structure. FIG. 19 is a graph illustrating a method for calculating the gate length by an extrapolation operation.

Figure 18B:
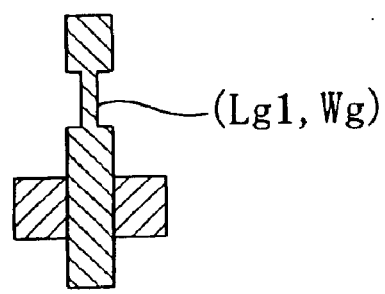
Figure 18C:
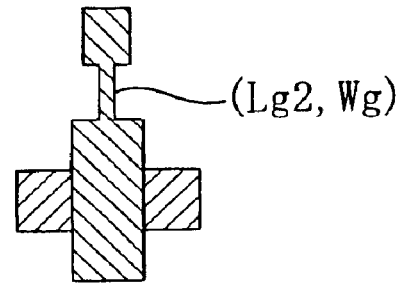
Figure 19:
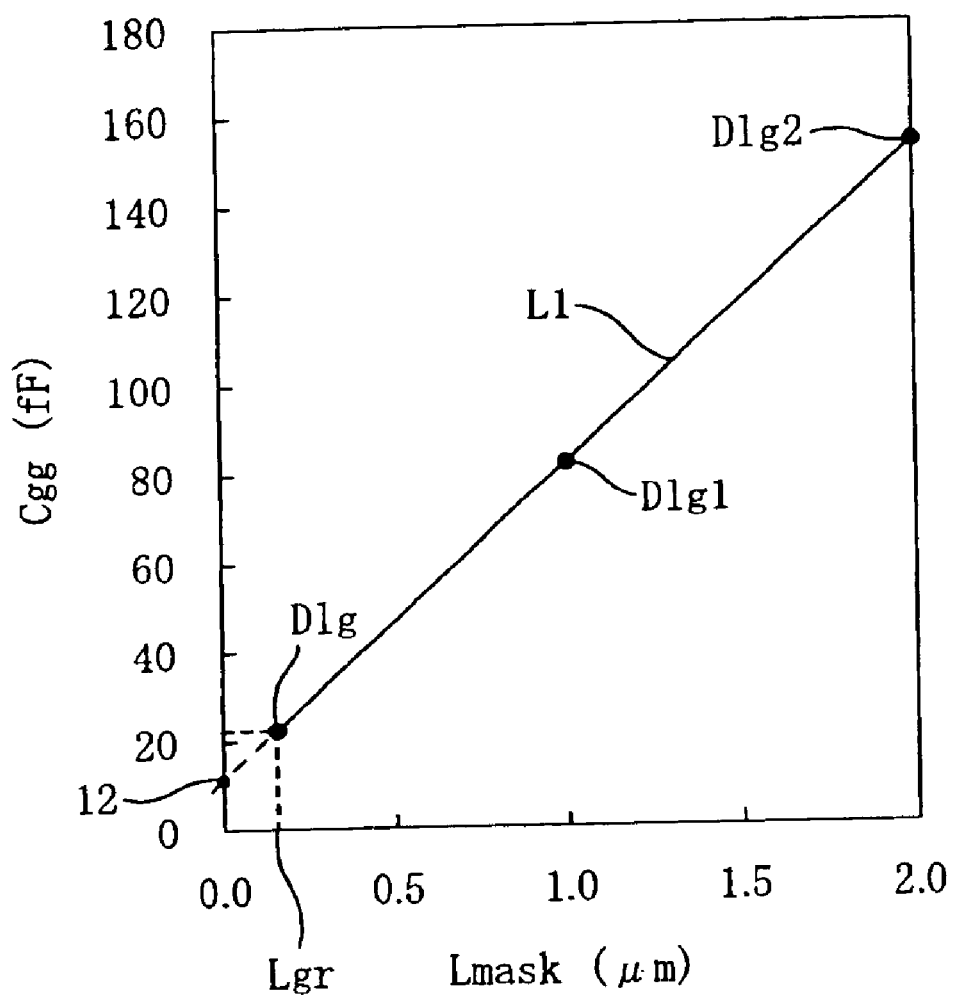
FIG. 19 is a graph illustrating a method for calculating the gate length by an extrapolation operation.

Two samples as illustrated in FIG. 18B and FIG. 18C are prepared whose masks have a gate width of Wg, i.e., the same as that of the gate to be evaluated that has the target capacitance Ct, and gate lengths of Lg1 and Lg2, respectively, that are greater than the gate length Lg of the gate to be evaluated. Then, with the sample gates illustrated in FIG. 18B and FIG. 18C being separately added to a CBCM device each as a capacitor having the target capacitance Ct, the capacitance Cgg of each sample gate is measured by the CBCM method. In this process, the value of Cgg for Vgb=2 V (fully inverted) in the C-V characteristics illustrated in FIG. 17 is used.

For example, assume that the gate length (mask dimension) of the gate to be evaluated is 0.15 µm, the gate lengths (mask dimensions) of the two sample gates are 1 µm and 2 µm, respectively, and the gate width Wg (mask dimension) is 10 µm for all the gates. Then, two points Dlg1 and Dlg2 are plotted as illustrated in FIG. 19 based on the two obtained capacitance values Cgg and the corresponding mask gate lengths Lmask. Then, a straight line LI is produced from the two points Dlg1 and Dlg2. Since the gate length and the gate width of the sample gates are greater than those of the gate to be evaluated, the error in the final dimension with respect to the mask dimension is small. For example, when the difference between the final gate length and the mask gate length is 0.02 µm, the difference is an error of only about 2% with respect to the gate length, 1 µm, of the sample gate. On the other hand, since the gate length of the gate to be evaluated is 0.15 µm, the same dimensional error, 0.02 µm, is an error of 10%. Thus, up to the extrapolation operation, the final dimension of the sample gate can be regarded as being substantially equal to the mask dimension, and it is still possible to maintain a sufficiently high precision in producing the straight line L1 for extrapolation.

Then, a capacitance measurement by the CBCM method is performed by using a gate whose mask has a gate length of Lg and a gate width of Wg, as illustrated in FIG. 18A, as a capacitor having the target capacitance Ct in the CBCM device illustrated in FIG. 1. Then, the capacitance value obtained by the capacitance measurement is subjected to an extrapolation operation using the straight line L1, thereby calculating the actual dimension Lgr, but not the mask dimension, of the gate having the target capacitance. In this example, it can be seen that the actual gate length Lgr of the gate to be evaluated is about 0.15 µm.

Figure 18D:
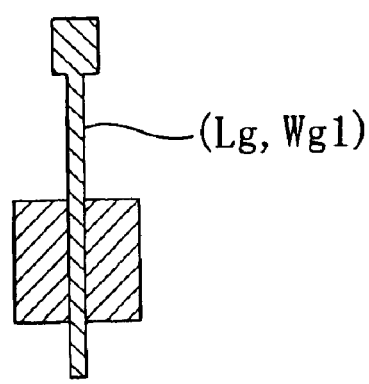
Figure 18E:
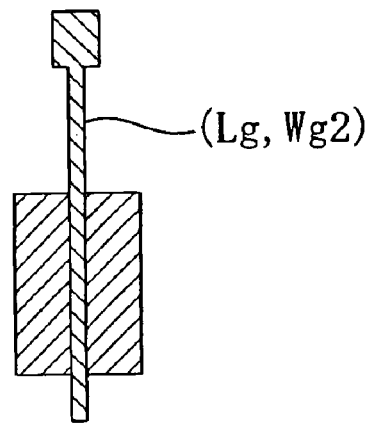

Moreover, the gate width Wg can be calculated by the extrapolation operation using a straight line as described above, by using two gate structures whose mask dimensions have the same gate length (Lg) and different gate widths (Wg1 and Wg2), as illustrated in FIG. 18D and FIG. 18E. Thus, it is possible to calculate the gate width Wgr of a gate structure having the target capacitance Ct by producing basically the same straight line as that illustrated in FIG. 19 in a graph whose horizontal axis represents the gate width Wmask.

Moreover, since the intercept of the extrapolation line L1 illustrated in FIG. 19 (i.e., the point where Lmask=0 µm) is 12 fF, the parasitic capacitance, which is irrespective of the dimensional evaluation, can be known to be 12 fF, in addition to the knowledge of the dummy capacitance and the transistor parasitic capacitance, which are used in the CBCM measurement.

In recent years, a pocket implantation region whose conductivity type is opposite to that of the source/drain region is often formed in a MIS transistor, it is becoming difficult to obtain the gate length Lg or the gate width Wg from the I-V characteristics.

In contrast, according to the capacitance measurement method using the CBCM semiconductor device and the CBCM method of the present embodiment, at least two sample patterns are prepared for one pattern for which the target capacitance is evaluated. Then, a straight line for extrapolation can be produced by utilizing the fact that the post-process dimension of a sample pattern having a larger dimension (the sample gate in the present embodiment) can be regarded as being substantially equal to the mask dimension, and the target pattern (the gate to be evaluated in the present embodiment) can be obtained by an extrapolation operation.

Moreover, by preparing at least two sample patterns, the parasitic capacitance, which is irrespective of the dimensional evaluation, can be canceled out, whereby it is possible to precisely estimate the dimension of the target pattern.

Variation of Seventh Embodiment

FIG. 29 is a block circuit diagram schematically illustrating a circuit configuration of a CBCM measurement device used in a variation of the seventh embodiment of the present invention.

As illustrated in the figure, the CBCM device of the present variation includes first, second and third series circuits Sca, Scb and Scc, including many of the members of the CBCM device of the sixth embodiment. The series circuits Sca, Scb and Scc include PMIS transistors 11a, 11b and 11c and NMIS transistors 13a, 13b and 13c, which are connected in series with the PMIS transistors 11a, 11b and 11c, respectively. In the series circuit Sca, the PMIS transistor 11a and the NMIS transistor 13a are connected to each other via a common intermediate node Na. In the series circuit Scb, the PMIS transistor 11b and the NMIS transistor 13b are connected to each other via a common intermediate node Nb. In the series circuit Scc, the PMIS transistor 11c and the NMIS transistor 13c are connected to each other via a common intermediate node Nc. The intermediate nodes Na, Nb and Nc are grounded via a common node Nx.

Moreover, the series circuits Sea, Scb and Scc are provided with the current measurement pad 20 for measuring current Ia, Ib and Ic flowing through the PMIS transistors 11a, 11b and 11c, respectively.

Moreover, the CBCM measurement device of the present variation includes first, second and third MIS transistors TrA, TrB and TrC provided on the triple-well region 74a illustrated in FIG. 14 and FIG. 15. Herein, the gates of the first, second and third MIS transistors TrA, TrB and TrC are shaped as illustrated in FIG. 18A, FIG. 18B and FIG. 18C, respectively. Thus, the gate of the first MIS transistor TrA has a gate width (width in a first direction) that is equal to the first dimension Wg and a gate length (width in a second direction) that is equal to the second dimension Lg. The gate of the second MIS transistor TrB has a gate width (width in the first direction) that is equal to the first dimension Wg and a gate length (width in the second direction) that is equal to the third dimension Lg1, which is greater than the second dimension Lg. The gate of the third MIS transistor TrC has a gate width (width in the first direction) that is equal to the first dimension Wg and a gate length (width in the second direction) that is equal to the fourth dimension Lg2, which is greater than the third dimension Lg1.

The gate of the first MIS transistor TrA is connected to the intermediate node Na of the first series circuit Sca, the gate of the second MIS transistor TrB is connected to the intermediate node Nb of the second series circuit Scb, and the gate of the third MIS transistor TrC is connected to the intermediate node Nc of the third series circuit Scc.

Furthermore, the CBCM device includes the control signal generator 31, which is means for generating a control signal for turning the transistors ON/OFF. By using the control signal generator 31, the control voltage V1 is supplied to the gates of the NMIS transistors 13a, 13b and 13c of the series circuits Sca, Scb and Scc, and the control voltage V2 to the gates of the PMIS transistors 11a, 11b and 11c of the series circuits Sca, Scb and Scc.

Moreover, the triple-well regions 74a of the MIS transistors TrA, TrB and TrC are connected to pads 33 for supplying the substrate voltage Vsub. Thus, it is possible to independently control the voltage of each triple-well region 74a.

Then, it is possible to measure a capacitance using an extrapolation operation as illustrated in FIG. 19, with the gates of the second and third MIS transistors TrB and TrC of the present variation being the sample gates and the gate of the first MIS transistor TrA being the gate to be evaluated. In such a case, in addition to the effects of the seventh embodiment, it is possible to easily and relatively precisely measure the voltage dependence of a capacitance in an actual process. Particularly, it is possible to set the voltage at the current measurement terminal of the MIS transistor to be evaluated to be very small.

Eighth Embodiment

Figure 20:
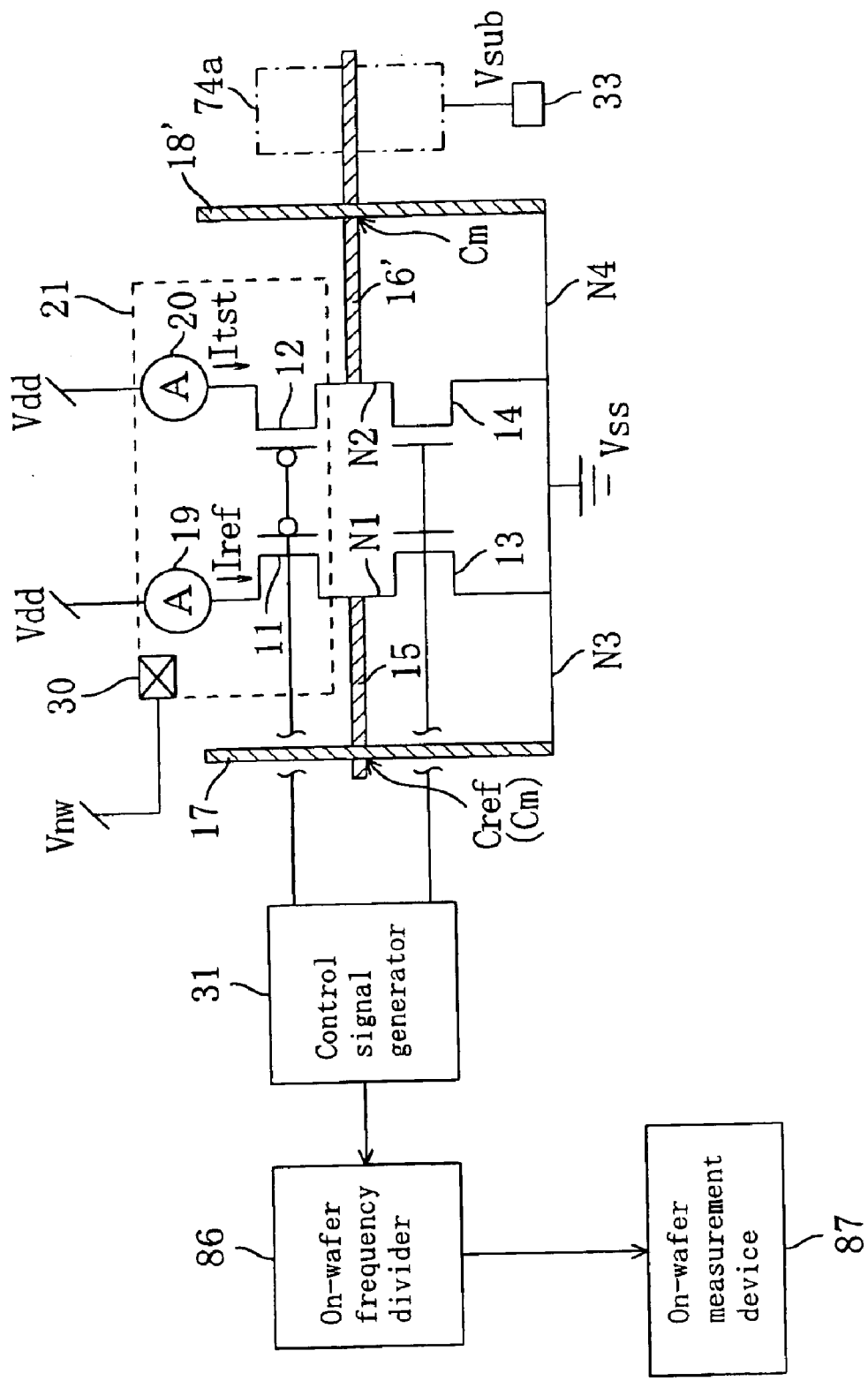
FIG. 20 is a block circuit diagram schematically illustrating a circuit configuration of a CBCM measurement device used in the eighth embodiment of the present invention.
Figure 21:
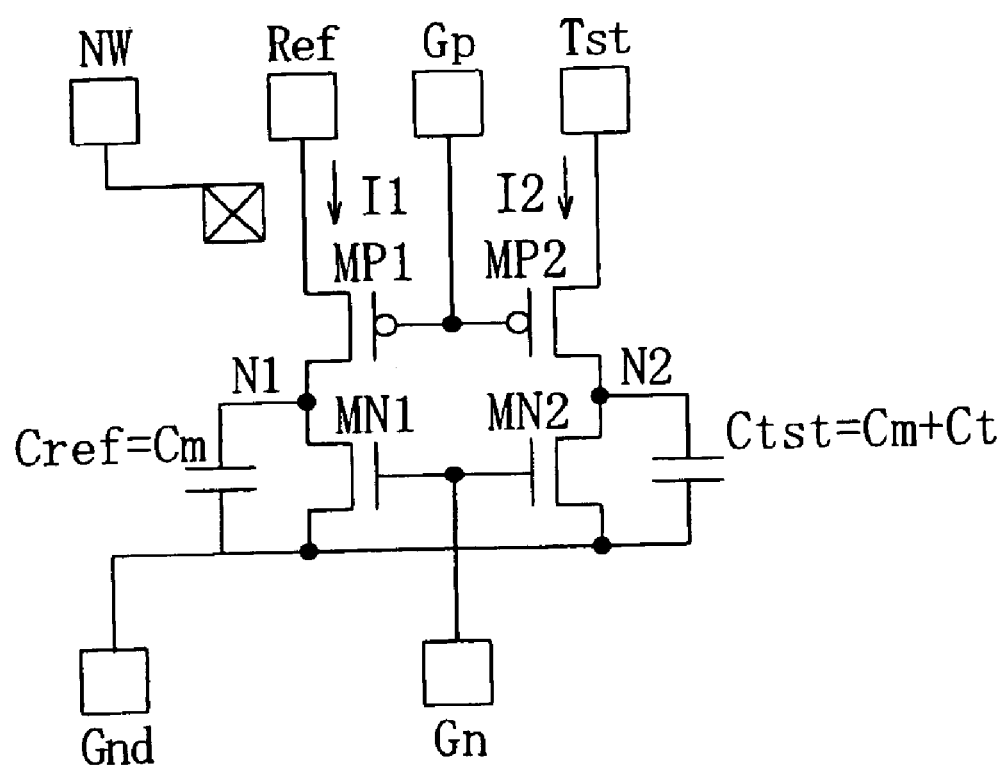
FIG. 21 is a block circuit diagram schematically illustrating a circuit configuration of a measurement device for measuring the line capacitance of a semiconductor device using a conventional CBCM method.
Figure 22:
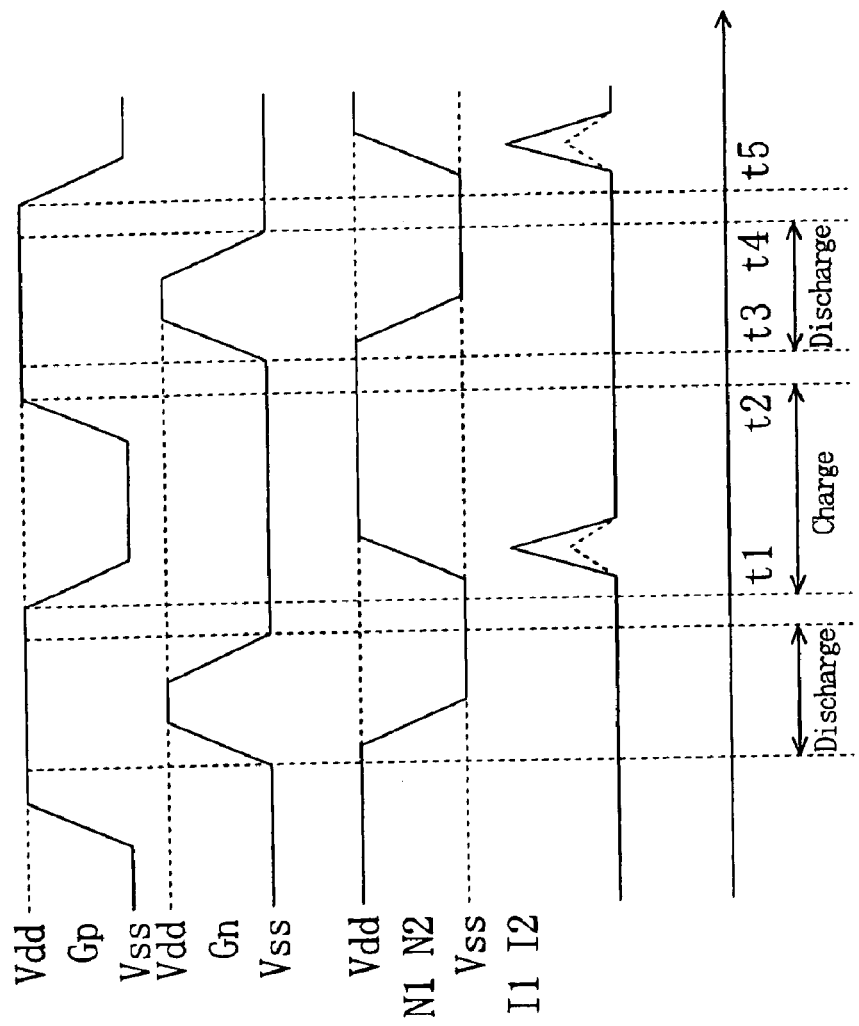
FIG. 22 is a timing chart illustrating the temporal transitions of gate control signals supplied from pads Gp and Gn to the respective transistors and the potential at the nodes N1 and N2 in the measurement device illustrated in FIG. 21.

FIG. 20 is a block circuit diagram schematically illustrating a circuit configuration of a CBCM measurement device used in the eighth embodiment of the present invention.

As illustrated in the figure, the CBCM measurement device of the present embodiment includes many of the members of the CBCM device of the first embodiment illustrated in FIG. 1. Specifically, the CBCM device of the present embodiment includes the reference PMIS transistor 11, the test PMIS transistor 12, the reference NMIS transistor 13 and the test NMIS transistor 14, and the reference PMIS transistor 11 and the reference NMIS transistor 13 are connected to each other via the common first node N1, while the test PMIS transistor 12 and the test NMIS transistor 14 are connected to each other via the common second node N2.

Furthermore, the CBCM device includes the first reference conductor section 15, the first test conductor section 16', the second reference conductor section 17 and the second test conductor section 18'. The second reference conductor section 17 and the second test conductor section 18' are grounded via the nodes N3 and N4, respectively.

Furthermore, the CBCM device includes the control signal generator 31, which is means for generating a control signal for turning the transistors ON/OFF. By using the control signal generator 31, the control voltage V1 is supplied to the gates of the reference NMIS transistor 13 and the test NMIS transistor 14, and the control voltage V2 to the gates of the reference PMIS transistor 11 and the test PMIS transistor 12.

Moreover, the CBCM device includes the reference current measurement pad 19 for measuring the reference current Iref flowing through the reference PMIS transistor 11, and the test current measurement pad 20 for measuring the test current Itst flowing through the test PMIS transistor 12.

Furthermore, as in the sixth embodiment, the first test conductor section 16' extends over the triple-well region 74a of the substrate, and a capacitor having the target capacitance Ct' is formed between the first test conductor section 16' and the substrate. Moreover, the pad 33 is provided for supplying the voltage Vsub control the voltage of the triple-well region 74a. Thus, it is possible to independently control the voltage of the triple-well region 74a. In the present embodiment, a capacitor having the reference capacitance Cref, which is equal to the dummy capacitance Cm, is formed between the first and second reference conductor sections 15 and 17, and a capacitor having the dummy capacitance Cm is formed between the first and second test conductor sections 16' and 18'.

The present embodiment is also assumed to be used with the semiconductor device having a triple-well structure of the sixth embodiment illustrated in FIG. 15.

Furthermore, a feature of the present embodiment is that the control signal generator 31, which is an on-wafer pulse generator, and an on-wafer frequency divider 86 are arranged on the substrate while a frequency measurement device 87 is arranged outside the substrate, as illustrated in FIG. 20.

With a recent process generation employing a design rule of 0.1 µm or less, it is possible that the measured capacitance may not be evaluated accurately due to a gate leak resulting from a reduced thickness of the gate oxide film. The influence of the gate leak on the gate capacitance can be removed by increasing the frequency f However, it is difficult to precisely measure a high frequency, this may lower the precision of the measured value of the target capacitance obtained by using Expression (2). In contrast, in the present embodiment, the frequency is lowered to $1/2^N$ by the on-wafer frequency divider 86 before measuring the frequency f by the external frequency measurement device 87 (an off-wafer measurement device). Therefore, it is possible, in principle, to increase the measurement frequency f to be on the order of 100 MHz, whereby it is possible to remove the adverse influence of the gate leak in the gate capacitance measurement.

Thus, in a measurement process by the CBCM method, the measurement frequency can be significantly increased, thus relatively reducing the proportion of the leak component in the measured current value. Therefore, it is possible to increase the precision of the capacitance measurement. Thus, it is possible to measure the capacitance of a gate having an ultra-thin oxide film by using the control signal generator 31, which is a pulse generator provided on a wafer.

What is claimed is:

1. A semiconductor device, comprising a capacitance measurement circuit provided in a portion of a semiconductor substrate, the capacitance measurement circuit including a reference circuit and a test circuit, wherein:

the reference circuit includes:
a reference series circuit including two reference switching elements connected in series with each other via a first node therebetween, the two reference switching elements being turned ON/OFF at different timings from each other;
a pair of first voltage supply sections for supplying two voltages, one being higher than the other, respectively to opposite ends of the reference series circuit;
a first reference conductor section connected to the first node; and
a second reference conductor section, with a dummy capacitor being formed between the first reference conductor section and the second reference conductor section, and the dummy capacitor having a dummy capacitance;

the test circuit includes:
a test series circuit including two test switching elements connected in series with each other via a second node therebetween, the two test switching elements being turned ON/OFF at different timings from each other;
a pair of second voltage supply sections for supplying two voltages, one being higher than the other, respectively to opposite ends of the test series circuit;
a first test conductor section connected to the second node; and
a second test conductor section, with a test capacitor being formed between the first test conductor section and the second test conductor section, and the test capacitor having a test capacitance that can be represented by a sum of the dummy capacitance and a target capacitance; and the semiconductor device further comprises voltage suppression means for suppressing an amount of voltage change due to an overshoot or an undershoot in each of the switching elements of the capacitance measurement circuit.

2. The semiconductor device of claim 1, wherein the voltage suppression means is first voltage control means for setting the first reference conductor section and the first test conductor section so that the dummy capacitance is ten times or more as much as a gate-drain overlap capacitance of each of the switching elements.

3. The semiconductor device of claim 1, wherein:
in each of the series circuits, the two switching elements are a P-channel MIS transistor provided on a higher-voltage side and an N-channel MIS transistor provided on a lower-voltage side; and
the voltage suppression means is second voltage control means such that a gate width of the P-channel MIS transistor is larger than that of the N-channel MIS transistor so that the P-channel MIS transistor and the N-channel MIS transistor have the same drivability.

4. The semiconductor device of claim 1, wherein the voltage suppression means is third voltage control means such that one cycle of a switching operation of each of the series circuits includes a total of eight periods including one period in which both switching elements are OFF, four periods in which either one switching element rises or falls, one period in which both switching elements are ON, and two periods in which one switching element is ON and the other switching element is OFF, each of the four periods in which either one switching element rises or falls being set to exceed ⅛ of the one cycle.

5. The semiconductor device of claim 1, wherein the voltage suppression means is fourth voltage control means such that the dummy capacitance is twice or more as much as the target capacitance.

6. The semiconductor device of claim 5, wherein:
the dummy capacitance is the target capacitance times N (N is an integer equal to or greater than one);
the test capacitance is the target capacitance times M (M is an integer greater than one); and
M>N.

7. The semiconductor device of claim 6, wherein M=N+1.

8. The semiconductor device of claim 6, wherein M≧N+2.

9. The semiconductor device of claim 1, further comprising a triple-well region provided in the semiconductor substrate, wherein:
the first test conductor section extends over the triple-well region; and
a voltage of the triple-well region can be controlled independently of turning ON/OFF of the switching transistors.

10. The semiconductor device of claim 1, further comprising a control circuit for generating a control signal for turning the switching transistors ON/OFF at different timings from each other.

11. The semiconductor device of claim 10, further comprising a frequency divider provided on the semiconductor substrate and connected to the control circuit for dividing a frequency of an output signal of the control circuit.

* * * * *